United States Patent

Enya et al.

(10) Patent No.: US 8,809,868 B2
(45) Date of Patent: Aug. 19, 2014

(54) GROUP-III NITRIDE SEMICONDUCTOR DEVICE, METHOD FOR FABRICATING GROUP-III NITRIDE SEMICONDUCTOR DEVICE, AND EPITAXIAL SUBSTRATE

(75) Inventors: Yohei Enya, Itami (JP); Takashi Kyono, Itami (JP); Takamichi Sumitomo, Itami (JP); Yusuke Yoshizumi, Itami (JP); Koji Nishizuka, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 108 days.

(21) Appl. No.: 13/289,813

(22) Filed: Nov. 4, 2011

(65) Prior Publication Data

US 2012/0112203 A1    May 10, 2012

(30) Foreign Application Priority Data

Nov. 5, 2010    (JP) ................ P2010-248932

(51) Int. Cl.
     H01L 31/0312    (2006.01)
     H01L 33/00    (2010.01)
     H01L 29/20    (2006.01)
     H01L 31/0304    (2006.01)

(52) U.S. Cl.
     USPC ........ 257/76; 257/99; 257/615; 257/E29.089; 257/E33.023

(58) Field of Classification Search
     USPC .............. 257/76, 99, 615, E29.089, E33.033
     See application file for complete search history.

(56) References Cited

U.S. PATENT DOCUMENTS

| | | | | |
|---|---|---|---|---|
| 7,190,004 B2 * | 3/2007 | Nagai et al. | ................ | 257/102 |
| 2011/0309328 A1 * | 12/2011 | Kyono et al. | ................ | 257/13 |

FOREIGN PATENT DOCUMENTS

| | | |
|---|---|---|
| JP | 06-209122 A | 7/1994 |
| JP | 2004-363622 | 12/2004 |
| JP | 2010-192865 | 9/2010 |
| JP | 2010-212651 | 9/2010 |
| JP | 2010-219490 | 9/2010 |
| WO | WO-2008/117750 A1 | 10/2008 |
| WO | WO-2008/153130 A1 | 12/2008 |
| WO | WO-2010/041657 A1 | 4/2010 |
| WO | WO-2010/090262 A1 | 8/2010 |

OTHER PUBLICATIONS

International Preliminary Report on Patentability and Written Opinion in PCT International Patent Application No. PCT/JP2011/074973, dated May 16, 2013.

* cited by examiner

*Primary Examiner* — David S Blum
(74) *Attorney, Agent, or Firm* — Venable LLP; Michael A. Sartori; Tamatane J. Aga

(57) ABSTRACT

Provided is a Group III nitride semiconductor device, which comprises an electrically conductive substrate including a primary surface comprised of a first gallium nitride based semiconductor, and a Group III nitride semiconductor region including a first p-type gallium nitride based semiconductor layer and provided on the primary surface. The primary surface of the substrate is inclined at an angle in the range of not less than 50 degrees, and less than 130 degrees from a plane perpendicular to a reference axis extending along the c-axis of the first gallium nitride based semiconductor, an oxygen concentration Noxg of the first p-type gallium nitride based semiconductor layer is not more than $5 \times 10^{17}$ cm$^{-3}$, and a ratio (Noxg/Npd) of the oxygen concentration Noxg to a p-type dopant concentration Npd of the first p-type gallium nitride based semiconductor layer is not more than $\frac{1}{10}$.

22 Claims, 10 Drawing Sheets

(a)

| |
|---|
| p+GaN 0.050um |
| p-In$_{0.03}$Al$_{0.14}$GaN 0.40um |
| p-GaN 0.250um |
| p-In$_{0.025}$GaN 0.050um |
| p-GaN 20nm |
| ud-In$_{0.025}$GaN 0.075um |
| ud-In$_{0.30}$GaN 3nm |
| n-In$_{0.025}$GaN 0.115um |
| n-GaN 0.250um |
| n-In$_{0.03}$Al$_{0.14}$GaN 1.2um |
| n-GaN 1.1um |
| GaN substrate |

(b)

| Layer | Tc | H2/N2 |
|---|---|---|
| p+GaN | 870°C | N2 |
| p-InAlGaN | 870°C | N2 |
| p-GaN | 840°C | N2 |
| p-InGaN | 840°C | N2 |
| p-GaN | 840°C | N2 |
| ud-InGaN | 840°C | N2 |
| ud-InGaN | 720°C | N2 |
| n-InGaN | 840°C | N2 |
| n-GaN | 840°C | N2 |
| n-InAlGaN | 870°C | N2 |
| n-GaN | 950°C | N2 |
| THERMAL TREATMENT | 1050°C | H2 |

| |
|---|
| p+-GaN 0.050um |
| p-In0.03Al0.14Ga N 0.40um |
| p-GaN 0.250um |
| p-In0.03GaN 0.050um |
| p-GaN 20nm |
| ud-In0.03GaN 0.075um |
| ud-In0.30GaN 3nm |
| n-In0.03GaN 0.115um |
| n-GaN 0.250um |
| n-In0.03Al0.14GaN 1.2um |
| n-GaN 1.1um |
| GaN substrate |

(b)

| Layer | Tc | H2/N2 | Mg CONCENTRATION | O CONCENTRATION | O/Mg |
|---|---|---|---|---|---|
| p+-GaN | 900°C | H2 | 3e20 | 5e18 | 0.017 |
| p-InAlGaN | 870°C | N2 | 7e18 | 5e17 | 0.071 |
| p-GaN | 900°C | H2 | 3e18 | 2e18 | 0.667 |
| p-InGaN | 840°C | N2 | 3e18 | 2e17 | 0.067 |
| p-GaN | 900°C | H2 | 9e18 | 5e18 | 0.556 |
| ud-InGaN | 840°C | N2 | | | |
| ud-InGaN | 720°C | N2 | | | |
| n-InGaN | 840°C | N2 | | | |
| n-GaN | 1050°C | H2 | | | |
| n-InAlGaN | 870°C | N2 | | | |
| n-GaN | 950°C | H2 | | | |
| THERMAL TREATMENT | 1050°C | H2 | | | |

| Layer | Tc | H2/N2 | Mg CONCENTRATION | O CONCENTRATION | O/Mg |
|---|---|---|---|---|---|
| p+GaN | 900°C | H2 | 3e20 | 5e18 | 0.017 |
| p-InAlGaN | 870°C | N2 | 7e18 | 5e17 | 0.071 |
| p-GaN | 840°C | N2 | 3e18 | 2e17 | 0.067 |
| p-InGaN | 840°C | N2 | 3e18 | 2e17 | 0.067 |
| p-GaN | 900°C | H2 | 9e18 | 5e18 | 0.556 |
| ud-InGaN | 840°C | N2 | | | |
| ud-InGaN | 720°C | N2 | | | |
| n-InGaN | 840°C | H2 | | | |
| n-GaN | 1050°C | H2 | | | |
| n-InAlGaN | 870°C | N2 | | | |
| n-GaN | 950°C | H2 | | | |
| THERMAL TREATMENT | 1050°C | H2 | | | |

(a)

| p+GaN 0.050um |
| p-In$_{0.03}$Al$_{0.14}$GaN 0.40um |
| p-GaN 0.250um |
| p-In$_{0.03}$GaN 0.050um |
| p-GaN 20nm |
| ud-In$_{0.025}$GaN 0.075um |
| ud-In$_{0.30}$GaN 3nm |
| n-In$_{0.025}$GaN 0.115um |
| n-GaN 0.250um |
| n-In$_{0.03}$Al$_{0.14}$GaN 1.2um |
| n-GaN 1.1um |
| GaN substrate |

| Layer | Tc | H2/N2 | Mg CONCENTRATION | O CONCENTRATION | O/Mg |
|---|---|---|---|---|---|
| p+GaN | 900°C | H2 | 3e20 | 5e18 | 0.017 |
| p-InAlGaN | 870°C | N2 | 7e18 | 5e17 | 0.071 |
| p-GaN | 840°C | N2 | 3e18 | 1e17 | 0.033 |
| p-InGaN | 840°C | N2 | 3e18 | 1e17 | 0.033 |
| p-GaN | 840°C | N2 | 9e18 | 1e17 | 0.011 |
| ud-InGaN | 840°C | N2 | | | |
| ud-InGaN | 720°C | N2 | | | |
| n-InGaN | 840°C | N2 | | | |
| n-GaN | 1050°C | H2 | | | |
| n-InAlGaN | 870°C | N2 | | | |
| n-GaN | 950°C | H2 | | | |
| THERMAL TREATMENT | 1050°C | H2 | | | |

(a)

| p+GaN 0.050um |
| p-In0.03Al0.14GaN 0.40um |
| p-GaN 0.250um |
| p-In0.025GaN 0.050um |
| p-GaN 20nm |
| ud-In0.025GaN 0.075um |
| ud-In0.30GaN 3nm |
| n-In0.025GaN 0.115um |
| n-GaN 0.250um |
| n-In0.03Al0.14GaN 1.2um |
| n-GaN 1.1um |
| GaN substrate |

| |
|---|
| p+GaN 0.050um |
| p-In0.03 Al0.14 GaN 0.40um |
| p-GaN 0.250um |
| p-In0.025 GaN 0.050um |
| p-GaN 20nm |
| ud-In0.025 GaN 0.075um |
| ud-In0.30 GaN 3nm |
| n-In0.025 GaN 0.115um |
| n-GaN 0.250um |
| n-In0.03 Al0.14 GaN 1.2um |
| n-GaN 1.1um |
| GaN substrate |

(b)

| Layer | Tc | H2/N2 | Mg CONCENTRATION | O CONCENTRATION | O/Mg |
|---|---|---|---|---|---|
| p+GaN | 870°C | N2 | 3e20 | 3e17 | 0.010 |
| p-InAlGaN | 870°C | N2 | 7e18 | 5e17 | 0.071 |
| p-GaN | 840°C | N2 | 3e18 | 1e17 | 0.067 |
| p-InGaN | 840°C | N2 | 3e18 | 1e17 | 0.067 |
| p-GaN | 840°C | N2 | 9e18 | 1e17 | 0.022 |
| ud-InGaN | 840°C | N2 | | | |
| ud-InGaN | 720°C | N2 | | | |
| n-InGaN | 840°C | H2 | | | |
| n-GaN | 1050°C | N2 | | | |
| n-InAlGaN | 870°C | H2 | | | |
| n-GaN | 950°C | H2 | | | |
| THERMAL TREATMENT | 1050°C | H2 | | | |

| p+GaN 0.050um |
|---|
| p-In₀.₀₃Al₀.₁₄GaN 0.40um |
| p-GaN 0.250um |
| p-In₀.₀₂₅GaN 0.050um |
| p-GaN 20nm |
| ud-In₀.₀₂₅GaN 0.075um |
| ud-In₀.₃₀GaN 3nm |
| n-In₀.₀₂₅GaN 0.115um |
| n-GaN 0.250um |
| n-In₀.₀₃Al₀.₁₄GaN 1.2um |
| n-GaN 1.1um |
| GaN substrate |

(b)

| Layer | Tc | H2/N2 |
|---|---|---|
| p+GaN | 870°C | N2 |
| p-InAlGaN | 870°C | N2 |
| p-GaN | 840°C | N2 |
| p-InGaN | 840°C | N2 |
| p-GaN | 840°C | N2 |
| ud-InGaN | 840°C | N2 |
| ud-InGaN | 720°C | N2 |
| n-InGaN | 840°C | N2 |
| n-GaN | 840°C | N2 |
| n-InAlGaN | 870°C | N2 |
| n-GaN | 950°C | N2 |
| THERMAL TREATMENT | 1050°C | H2 |

# GROUP-III NITRIDE SEMICONDUCTOR DEVICE, METHOD FOR FABRICATING GROUP-III NITRIDE SEMICONDUCTOR DEVICE, AND EPITAXIAL SUBSTRATE

BACKGROUND OF THE INVENTION

1. Field of the Invention

The present invention relates to a Group III nitride semiconductor device, a method for fabricating a Group III nitride semiconductor device, and an epitaxial substrate.

2. Related Background Art

Patent Literature 1 discloses a growth method of an InGaN layer for a blue light emitting device. It defines the growth temperature and growth rate in InGaN growth.

Patent Literature 1: Japanese Patent Application Laid-open No. 6-209122

SUMMARY OF THE INVENTION

In the growth described in Patent Literature 1, a sapphire substrate is placed on a susceptor in a growth reactor and, thereafter, ammonia, TMG, and carrier gas of hydrogen are fed at the substrate temperature of 510 degrees Celsius to grow a GaN buffer layer. During this period, hydrogen and nitrogen are continuously supplied through a conical quartz tube, and the susceptor is slowly rotated. The surface of this GaN buffer layer is comprised of a c-plane. After the growth of the GaN buffer layer, using the same carrier gas of hydrogen, TMG is supplied to grow a GaN layer in the thickness of about 2 μm at the substrate temperature of 1020 degrees Celsius. After the growth of this GaN layer, the carrier gas is switched to nitrogen at the substrate temperature of 805 degrees Celsius and then TMG, TMI, ammonia, and silane are supplied to grow Si-doped InGaN. During the period of this InGaN growth, gas supplied through the conical quartz tube is only nitrogen.

According to Patent Literature 1, hydrogen and nitrogen are supplied in the growth of GaN on the c-plane, whereas nitrogen is supplied in the growth of InGaN.

According to Inventors' research, when Group III nitride is grown on a nonpolar plane which is not a polar plane, oxygen not supplied into the growth reactor is easier to be incorporated thereinto as impurity than on the c-plane GaN surface as described above, because of difference in crystal state of a semipolar surface. A gallium nitride based semiconductor not containing In, e.g., GaN or AlGaN, is grown with supply of hydrogen. In an atmosphere of hydrogen demonstrating high reducibility, oxygen is desorbed from resident matter, e.g., a jig and extraneous matter, in the growth reactor. In epitaxial growth on a nonpolar plane which is easy to incorporate oxygen, this oxygen is consequently incorporated into an epitaxial film thereon. Oxygen works as a compensating impurity in a p-type nitride semiconductor layer. Therefore, the epitaxial growth of the gallium nitride based semiconductor not containing In is carried out in the hydrogen-containing atmosphere, but this increases the resistance of the epitaxial layer and degrades the electrical characteristics of the semiconductor device.

One aspect of the present invention has been accomplished in view of the above circumstances, and it is an object of this aspect to provide a Group III nitride semiconductor device having a p-type gallium nitride based semiconductor layer with a reduced oxygen concentration; another aspect of the present invention has an object to provide a method for fabricating the Group III nitride semiconductor device, which can reduce an incorporation amount of oxygen impurity; furthermore, still another aspect of the present invention has an object to provide an epitaxial substrate for the Group III nitride semiconductor device.

A Group III nitride semiconductor device according to one aspect of the present invention comprises: (a) an electrically conductive substrate including a primary surface comprised of a first gallium nitride based semiconductor; and (b) a Group III nitride semiconductor region including a first p-type gallium nitride based semiconductor layer and provided on the primary surface. The primary surface of the substrate is inclined at an angle in the range of not less than 50 degrees and less than 130 degrees from a plane perpendicular to a reference axis extending along the c-axis of the first gallium nitride based semiconductor; an oxygen concentration of the first p-type gallium nitride based semiconductor layer is not more than $5\times10^{17}$ cm$^{-3}$; and a ratio (Noxg/Npd) of the oxygen concentration Noxg to a p-type dopant concentration Npd of the first p-type gallium nitride based semiconductor layer is not more than $\frac{1}{10}$.

In this Group III nitride semiconductor device, the first p-type gallium nitride based semiconductor layer is provided on the primary surface of the substrate, and this primary surface is inclined at the angle in the range of not less than 50 degrees and less than 130 degrees from the plane perpendicular to the reference axis extending along the c-axis of the first gallium nitride based semiconductor of the substrate. Since in this angle range the oxygen concentration in the first p-type gallium nitride based semiconductor layer can be made not more than $5\times10^{17}$ cm$^{-3}$, it is feasible to reduce the compensation of the p-type dopant in the first p-type gallium nitride based semiconductor layer by oxygen in the first p-type gallium nitride based semiconductor layer. Furthermore, since the ratio (Noxg/Npd) is not more than $\frac{1}{10}$, the p-type dopant concentration Npd can be lowered.

In the Group III nitride semiconductor device according to the one aspect of the present invention, preferably, the first p-type gallium nitride based semiconductor layer does not contain indium as a Group III constituent element. In this Group III nitride semiconductor device, the oxygen concentration can be reduced and the p-type dopant concentration Npd can be lowered in the gallium nitride semiconductor not containing indium as a Group III constituent element.

The Group III nitride semiconductor device according to the first aspect of the present invention can further comprise: an n-type gallium nitride based semiconductor layer provided on the primary surface; and a gallium nitride based semiconductor layer for a light emitting layer. The light emitting layer can be provided between the first p-type gallium nitride based semiconductor layer and the n-type gallium nitride based semiconductor layer, and the Group III nitride semiconductor device can be a light emitting device. This Group III nitride semiconductor device can improve the electrical characteristics of the p-type gallium nitride based semiconductor layer in the light emitting device.

In the Group III nitride semiconductor device according to the first aspect of the present invention, an emission wavelength of the light emitting layer can be not less than 440 nm and not more than 600 nm.

This Group III nitride semiconductor device can improve the electrical characteristics of the p-type gallium nitride based semiconductor in the light emitting device which emits light in the foregoing emission wavelength range.

In the Group III nitride semiconductor device according to the first aspect of the present invention, the emission wavelength of the light emitting layer can be not less than 490 nm and not more than 600 nm.

This Group III nitride semiconductor device can improve the electrical characteristics of the p-type gallium nitride based semiconductor in the light emitting device which provides emission of light having a long wavelength.

The Group III nitride semiconductor device according to the first aspect of the present invention can further comprise an electrode making contact with the Group III nitride semiconductor region. Preferably, the Group III nitride semiconductor region includes a contact layer making contact with the electrode, and a p-type Group III nitride semiconductor lamination, the p-type Group III nitride semiconductor lamination is provided between the contact layer and the light emitting layer, the p-type Group III nitride semiconductor lamination makes contact and a first junction with the contact layer and makes a second junction with the light emitting layer, an oxygen concentration of the p-type Group III nitride semiconductor lamination is not more than $5\times10^{17}$ cm$^{-3}$, and a ratio (Noxg/Npd) of the oxygen concentration Noxg to a p-type dopant concentration Npd of the p-type Group III nitride semiconductor lamination is not more than $1/10$.

In this Group III nitride semiconductor device, the oxygen concentration in the p-type Group III nitride semiconductor lamination is reduced and the ratio (Noxg/Npd) therein is reduced to not more than $1/10$ in a current path from the electrode to the light emitting layer. It can improve the electrical characteristics of the p-type Group III nitride semiconductor forming this current path.

In the Group III nitride semiconductor device according to the first aspect of the present invention, the first p-type gallium nitride based semiconductor layer can be comprised of GaN, InGaN, AlGaN, or InAlGaN.

In this Group III nitride semiconductor device, the oxygen concentration is reduced and the ratio (Noxg/Npd) is reduced to not more than $1/10$ in GaN, InGaN, AlGaN, or InAlGaN grown on the surface, which is not a polar plane, of the Group III nitride semiconductor.

In the Group III nitride semiconductor device according to the first aspect of the present invention, the first p-type gallium nitride based semiconductor layer can be comprised of GaN or AlGaN.

In this Group III nitride semiconductor device, the oxygen concentration is reduced and the ratio (Noxg/Npd) is reduced to not more than $1/10$ in GaN or AlGaN grown on the Group III nitride semiconductor surface which is not a polar plane.

In the Group III nitride semiconductor device according to the first aspect of the present invention, a carbon concentration of the first p-type gallium nitride based semiconductor layer can be not more than $1\times10^{17}$ cm$^{-3}$.

In the Group III nitride semiconductor device, the growth temperature of the p-layer semiconductor needs to be set lower, particularly, in fabricate of the light emitting device to emit light at a long wavelength, thereby increase the concentration of carbon impurity. According to Inventors' knowledge, it is possible to reduce not only the oxygen concentration but also the carbon concentration in the first p-type gallium nitride based semiconductor layer grown in a nitrogen atmosphere.

The Group III nitride semiconductor device according to the first aspect of the present invention can be configured as follows: the Group III nitride semiconductor region further includes a second p-type gallium nitride based semiconductor layer provided above the primary surface; an oxygen concentration of the second p-type gallium nitride based semiconductor layer is not more than $5\times10^{17}$ cm$^{-3}$; the second p-type gallium nitride based semiconductor layer contains indium as a Group III constituent element; a ratio (Noxg/Npd) of the oxygen concentration Noxg to a p-type dopant concentration Npd of the second p-type gallium nitride based semiconductor layer is not more than $1/10$.

In this Group III nitride semiconductor device, the oxygen concentration can also be reduced and the concentration ratio (Noxg/Npd) can also be reduced to not more than $1/10$ in the p-type gallium nitride based semiconductor layer containing indium as a Group III constituent element. Therefore, it is feasible to improve the electrical characteristics of this p-type Group III nitride semiconductor.

Another aspect of the present invention relates to a method for fabricating a Group III nitride semiconductor device. This method comprises: (a) a step of preparing an electrically conductive substrate including a primary surface comprised of a first gallium nitride based semiconductor; and (b) a step of growing a Group III nitride semiconductor region on the primary surface, the Group III nitride semiconductor region including a first p-type gallium nitride based semiconductor layer. In growth of the first p-type gallium nitride based semiconductor layer, a source gas for a Group III constituent element and a Group V constituent element of the first p-type gallium nitride based semiconductor layer, and a first atmosphere gas are supplied into a growth reactor; nitrogen is used as the first atmosphere gas, the primary surface of the substrate is inclined at an angle in the range of not less than 50 degrees and less than 130 degrees from a plane perpendicular to a reference axis extending along the c-axis of the first gallium nitride based semiconductor; an oxygen concentration of the first p-type gallium nitride based semiconductor layer is not more than $5\times10^{17}$ cm$^{-3}$; and a ratio (Noxg/Npd) of the oxygen concentration Noxg to a p-type dopant concentration Npd of the first p-type gallium nitride based semiconductor layer is not more than $1/10$.

According to this fabricating method, the first p-type gallium nitride based semiconductor layer is grown on the primary surface of the substrate and this primary surface is inclined at the angle in the range of not less than 50 degrees and less than 130 degrees from the plane perpendicular to the reference axis that extends along the c-axis of the first gallium nitride based semiconductor of the substrate. For this growth, the source gas for the first p-type gallium nitride based semiconductor layer, and the first atmosphere gas are supplied into the growth reactor and nitrogen is used as this atmosphere gas. For this reason, the oxygen concentration of the first p-type gallium nitride based semiconductor layer can be reduced to not more than $5\times10^{17}$ cm$^{-3}$. It is feasible to reduce compensation of the p-type dopant in the first p-type gallium nitride based semiconductor layer by oxygen in the first p-type gallium nitride based semiconductor layer. Since the concentration ratio (Noxg/Npd) is not more than $1/10$, the p-type dopant concentration Npd can be lowered.

In the fabricating method according to the other aspect of the present invention, the first p-type gallium nitride based semiconductor layer cannot contain indium as a Group III constituent element. By this fabricating method, the oxygen concentration can be reduced and the aforementioned concentration ratio can be lowered in the gallium nitride based semiconductor not containing indium as a Group III constituent element.

The fabricating method according to the other aspect of the present invention can further comprise: a step of growing an n-type gallium nitride based semiconductor layer on the primary surface; and a step of growing a gallium nitride based semiconductor layer for an active layer above the primary surface. The active layer is provided between the p-type gallium nitride based semiconductor layer and the n-type gallium nitride based semiconductor layer, and the Group III nitride semiconductor device comprises a light emitting device. This fabricating method can improve the electrical characteristics of the p-type gallium nitride based semiconductor layer in the light emitting device.

In the fabricating method according to the other aspect of the present invention, an emission wavelength of the active layer can be not less than 440 nm and not more than 600 nm. This fabricating method can improve the electrical characteristics of the p-type gallium nitride semiconductor in the light emitting device which emits light in the aforementioned emission wavelength range.

In the fabricating method according to the other aspect of the present invention, the emission wavelength of the active layer can be not less than 490 nm and not more than 600 nm. This fabricating method can improve the characteristics of the p-type gallium nitride semiconductor in the light emitting device which provides emission of light of a long wavelength.

The fabricating method according to the other aspect of the present invention can further comprise a step of forming an electrode making contact with the Group III nitride semiconductor region. In a preferable embodiment, the Group III nitride semiconductor region includes a contact layer making contact with the electrode, and a p-type Group III nitride semiconductor lamination; the p-type Group III nitride semiconductor lamination is provided between the contact layer and the active layer; the p-type Group III nitride semiconductor lamination makes contact and a first junction with the contact layer and makes a second junction with the active layer; in growth of each of one or more p-type gallium nitride based semiconductor layers in the p-type Group III nitride semiconductor lamination, a source gas for a Group III constituent element and a Group V constituent element of each p-type gallium nitride based semiconductor layer, and a second atmosphere gas are supplied into the growth reactor; nitrogen is used as the second atmosphere gas; an oxygen concentration of the p-type Group III nitride semiconductor lamination is not more than $5 \times 10^{17}$ cm$^{-3}$; and a ratio (Noxg/Npd) of the oxygen concentration Noxg to a p-type dopant concentration Npd of the p-type Group III nitride semiconductor lamination is not more than $1/10$.

In this fabricating method, the oxygen concentration in the p-type Group III nitride semiconductor lamination is reduced and the ratio (Noxg/Npd) is reduced to not more than $1/10$ in a current path from the electrode to the active layer. This reduction can improve the electrical characteristics of the p-type Group III nitride semiconductor forming this current path.

In the fabricating method according to the other aspect of the present invention, the first p-type gallium nitride based semiconductor layer can be comprised of GaN, InGaN, AlGaN, or InAlGaN. In this fabricating method, the oxygen concentration is reduced and the ratio (Noxg/Npd) is reduced to not more than $1/10$ in GaN, InGaN, AlGaN, or InAlGaN grown on the Group III nitride semiconductor surface which is not a polar plane.

In the fabricating method according to the other aspect of the present invention, the first p-type gallium nitride based semiconductor layer can be comprised of GaN or AlGaN. In this fabricating method, the oxygen concentration is reduced and the ratio (Noxg/Npd) is reduced to not more than $1/10$ in GaN or AlGaN grown on the surface of the Group III nitride semiconductor which is not a polar plane.

In the fabricating method according to the other aspect of the present invention, a carbon concentration of the first p-type gallium nitride based semiconductor layer is preferably not more than $1 \times 10^{17}$ cm$^{-3}$. In this fabricating method, the growth temperature of the p-layer of semiconductor is set lower, particularly, in fabricate of the light emitting device to emit light of a long wavelength, and for this reason, the concentration of carbon impurity increases. According to Inventors' knowledge, it is possible to reduce not only the oxygen concentration but also the carbon concentration in the first p-type gallium nitride based semiconductor layer grown in a nitrogen atmosphere.

In the fabricating method according to the other aspect of the present invention, a surface roughness of the Group III nitride semiconductor region can be an arithmetic average roughness of not more than 1 nm. In this fabricating method, the arithmetic average roughness can be reduced in film formation realizing the low oxygen concentration, by the growth in the nitrogen atmosphere.

The fabricating method according to the other aspect of the present invention can be configured as follows: the Group III nitride semiconductor region further includes a second p-type gallium nitride based semiconductor layer; the second p-type gallium nitride based semiconductor layer contains indium as a Group III constituent element; in growth of the second p-type gallium nitride based semiconductor layer, a source gas for a Group III constituent element and a Group V constituent element of the second p-type gallium nitride based semiconductor layer, and a second atmosphere gas are supplied into the growth reactor; nitrogen is used as the second atmosphere gas; an oxygen concentration of the second p-type gallium nitride based semiconductor layer is not more than $5 \times 10^{17}$ cm$^{-3}$; a ratio (Noxg/Npd) of the oxygen concentration Noxg to a p-type dopant concentration Npd of the second p-type gallium nitride based semiconductor layer is not more than $1/10$.

In this fabricating method, the oxygen concentration can also be reduced and the concentration ratio (Noxg/Npd) can also be reduced to not more than $1/10$ in the p-type gallium nitride based semiconductor layer containing indium as a Group III constituent element. Accordingly, it is feasible to improve the electrical characteristics of this p-type Group III nitride semiconductor.

Still another aspect of the present invention relates to an epitaxial substrate for a Group III nitride semiconductor device. This epitaxial substrate comprises: (a) an electrically conductive substrate including a primary surface comprised of a first gallium nitride based semiconductor; and (b) a Group III nitride semiconductor region including a first p-type gallium nitride based semiconductor layer and provided on the primary surface. The primary surface of the substrate is inclined at an angle in the range of not less than 50 degrees and less than 130 degrees from a plane perpendicular to a reference axis extending along the c-axis of the first gallium nitride based semiconductor, an oxygen concentration of the first p-type gallium nitride based semiconductor layer is not more than $5 \times 10^{17}$ cm$^{-3}$, and a ratio (Noxg/Npd) of the oxygen concentration Noxg to a p-type dopant concentration Npd of the first p-type gallium nitride based semiconductor layer is not more than $1/10$.

In this epitaxial substrate, the first p-type gallium nitride based semiconductor layer is provided on the primary surface of the substrate, and this primary surface is inclined at the angle in the range of not less than 50 degrees and less than 130 degrees from the plane perpendicular to the reference axis that extends along the c-axis of the first gallium nitride based semiconductor of the substrate. Since this angle range allows the oxygen concentration in the first p-type gallium nitride based semiconductor layer to be not more than $5 \times 10^{17}$ cm$^{-3}$, it is feasible to reduce the phenomenon in which the p-type dopant in the first p-type gallium nitride based semiconductor layer is compensated by oxygen in the first p-type gallium nitride based semiconductor layer. Furthermore, since the ratio (Noxg/Npd) is not more than 1/10, the p-type dopant concentration Npd can be lowered.

In the epitaxial substrate according to the still other aspect of the present invention, the first p-type gallium nitride based semiconductor layer does not contain indium as a Group III constituent element.

In this epitaxial substrate, the oxygen concentration can be reduced and the concentration ratio can be lowered in the gallium nitride based semiconductor not containing indium as a Group III constituent element.

The epitaxial substrate according to the still other aspect of the present invention can further comprise: an n-type gallium nitride based semiconductor layer provided on the primary surface; and a gallium nitride based semiconductor layer for a light emitting layer. The light emitting layer can be provided between the p-type gallium nitride based semiconductor layer and the n-type gallium nitride based semiconductor layer, and the Group III nitride semiconductor device can be a light emitting device. This epitaxial substrate can improve the electrical characteristics of the p-type gallium nitride based semiconductor layer in the light emitting device.

In the epitaxial substrate according to the still other aspect of the present invention, an emission wavelength of the light emitting layer can be not less than 440 nm and not more than 600 nm. This epitaxial substrate can improve the electrical characteristics of the p-type gallium nitride based semiconductor in the light emitting device which emits light in the foregoing emission wavelength range.

In the epitaxial substrate according to the still other aspect of the present invention, the emission wavelength of the light emitting layer can be not less than 490 nm and not more than 600 nm. This epitaxial substrate can improve the electrical characteristics of the p-type gallium nitride based semiconductor in the light emitting device which provides emission of light at a long wavelength.

The epitaxial substrate according to the still other aspect of the present invention can be configured as follows: the whole of the Group III nitride semiconductor region has p-type conductivity, an oxygen concentration of the Group III nitride semiconductor region is not more than $5 \times 10^{17}$ cm$^{-3}$, and a ratio (Noxg/Npd) of the oxygen concentration Noxg to a p-type dopant concentration Npd of the Group III nitride semiconductor region is not more than 1/10.

In this epitaxial substrate, the oxygen concentration is reduced and the ratio (Noxg/Npd) is reduced to not more than 1/10 in the whole Group III nitride semiconductor region except for a p-type semiconductor part with a high dopant concentration. It can improve the characteristics of the p-type Group III nitride semiconductor that is located in the current path.

In the epitaxial substrate according to the still other aspect of the present invention, the first p-type gallium nitride based semiconductor layer can be comprised of GaN, InGaN, AlGaN, or InAlGaN. In this epitaxial substrate, the oxygen concentration is reduced and the ratio (Noxg/Npd) is reduced to not more than 1/10 in GaN, InGaN, AlGaN, or InAlGaN grown on the surface, which is not a polar plane, of the Group III nitride semiconductor.

In the epitaxial substrate according to the still other aspect of the present invention, the first p-type gallium nitride based semiconductor layer can be comprised of GaN or AlGaN. In this epitaxial substrate, the oxygen concentration is reduced, and the ratio (Noxg/Npd) is reduced to not more than 1/10 in GaN or AlGaN grown on the surface of not a polar plane of the Group III nitride semiconductor.

In the epitaxial substrate according to the still other aspect of the present invention, a carbon concentration of the first p-type gallium nitride based semiconductor layer can be not more than $1 \times 10^{17}$ cm$^{-3}$. In this epitaxial substrate, the growth temperature of the p-layer semiconductor needs to be set lower, particularly, in fabricate of the light emitting device to emit light at a long wavelength, and for this reason, the concentration of carbon impurity increases. According to Inventors' knowledge, it is possible to reduce not only the oxygen concentration but also the carbon concentration in the first p-type gallium nitride based semiconductor layer grown in a nitrogen atmosphere.

The epitaxial substrate according to the still other aspect of the present invention can be configured as follows: the Group III nitride semiconductor region further includes a second p-type gallium nitride based semiconductor layer provided above the primary surface; an oxygen concentration of the second p-type gallium nitride based semiconductor layer is not more than $5 \times 10^{17}$ cm$^{-3}$; the second p-type gallium nitride based semiconductor layer contains indium as a Group III constituent element; a ratio (Noxg/Npd) of the oxygen concentration Noxg to a p-type dopant concentration Npd of the second p-type gallium nitride based semiconductor layer is not more than 1/10.

In this epitaxial substrate, the oxygen concentration can also be reduced and the concentration ratio (Noxg/Npd) can also be reduced to not more than 1/10 in the p-type gallium nitride based semiconductor layer containing indium as a Group III constituent element. Accordingly, it is feasible to improve the characteristics of this p-type Group III nitride semiconductor.

In the epitaxial substrate according to the still other aspect of the present invention, a surface roughness of the epitaxial substrate can be an arithmetic average roughness of not more than 1 nm.

In this epitaxial substrate, the film formation condition to realize the low oxygen concentration can reduce the arithmetic average roughness in the surface of the epitaxial substrate.

The above objects and other objects, features, and advantages of the present invention will more readily become clear from the following detailed description of the preferred embodiments of the present invention proceeding with reference to the accompanying drawings.

BRIEF DESCRIPTION OF THE DRAWINGS

FIG. 6 is a drawing showing a device structure of a laser diode in Example 1, and atmosphere gases, p-type dopant concentrations, oxygen concentrations, and O/Mg ratios of epitaxial constituent layers for this device.

FIG. 7 is a drawing showing a device structure of a laser diode in Example 2, and atmosphere gases, p-type dopant concentrations, oxygen concentrations and O/Mg ratios of epitaxial constituent layers for this device.

FIG. 8 is a drawing showing a device structure of a laser diode in Example 3, and atmosphere gases, p-type dopant concentrations, oxygen concentrations and O/Mg ratios of epitaxial constituent layers for this device.

FIG. 9 is a drawing showing a device structure of a laser diode in Example 4, and atmosphere gases, p-type dopant concentrations, oxygen concentrations and O/Mg ratios of epitaxial constituent layers for this device.

FIG. 10 is a drawing showing a device structure of a laser diode in Example 5, and atmosphere gases of constituent layers of an epitaxial structure thereof.

DETAILED DESCRIPTION OF THE PREFERRED EMBODIMENTS

The expertise of the present invention can be readily understood in view of the following detailed description with reference to the accompanying drawings provided by way of illustration. The following will describe embodiments of the Group III nitride semiconductor device, epitaxial substrate, the method of fabricating the Group III nitride semiconductor device, and the method of fabricating the epitaxial substrate, with reference to the accompanying drawings. The same portions will be denoted by the same reference signs as much as possible.

Figure 1:
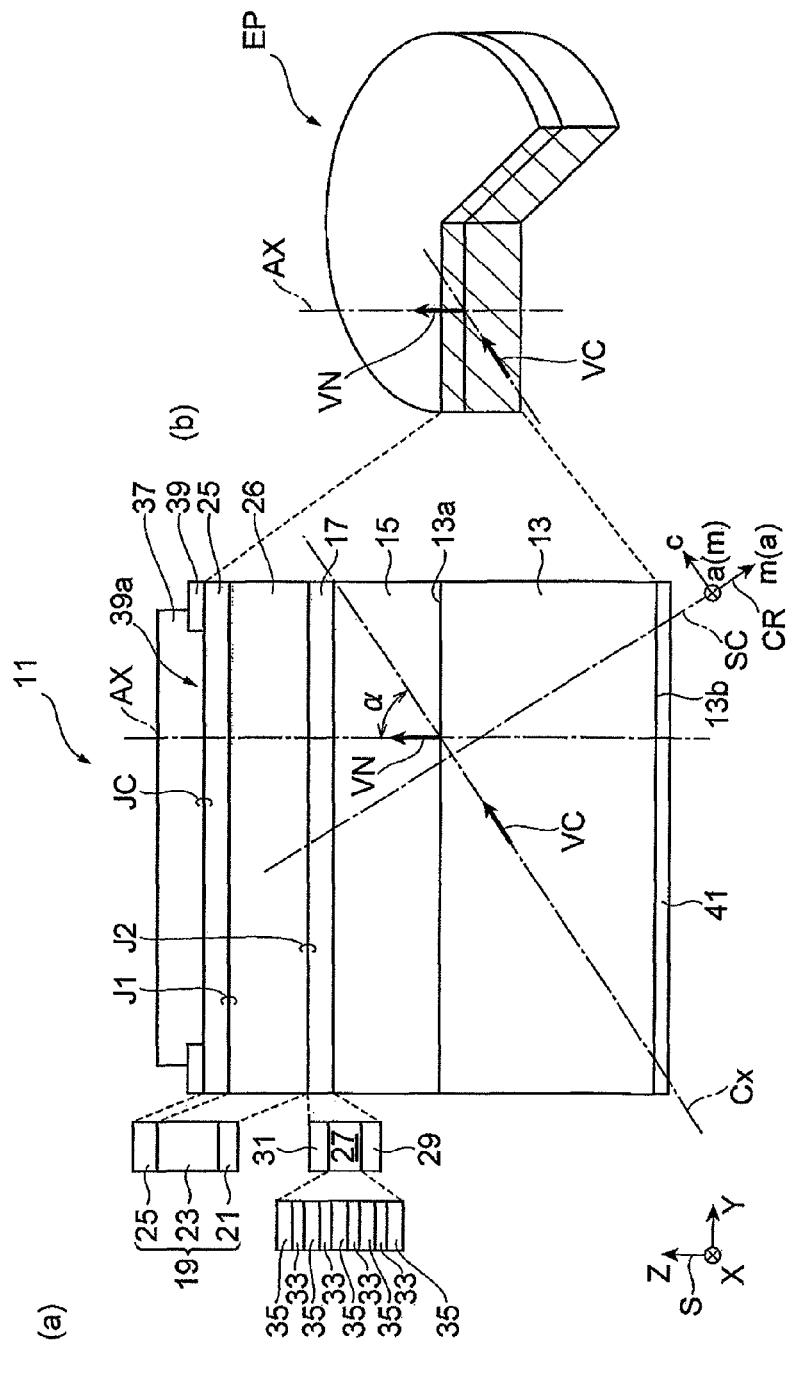
FIG. 1 is a drawing schematically showing a structure of a Group III nitride semiconductor device and a structure of an epitaxial substrate for the Group III nitride semiconductor device according to an embodiment of the present invention.

FIG. 1 is a drawing schematically showing the structure of the Group III nitride semiconductor device and the structure of the epitaxial substrate for the Group III nitride semiconductor device according to an embodiment of the present invention. In the description hereinafter, a light emitting device, e.g., a light emitting diode or a laser diode, will be explained as Group III nitride semiconductor device 11, but it should be noted that the present embodiment is applicable to Group III nitride semiconductor devices containing p-type Group III nitride semiconductors.

In FIG. 1, the Group III nitride semiconductor device 11 is illustrated in part (a) of FIG. 1 and the epitaxial substrate EP for the Group III nitride semiconductor device 11 in part (b) of FIG. 1. The epitaxial substrate EP has the same epitaxial layer structure as the Group III nitride semiconductor device 11. In the description hereinafter, semiconductor layers constituting the Group III nitride semiconductor device 11 will be explained. The epitaxial substrate EP includes semiconductor layers (semiconductor films) corresponding to these semiconductor layers and the description for the Group III nitride semiconductor device 11 is applied to the corresponding semiconductor layers.

Referring to FIG. 1, there are coordinate system S and crystal coordinate system CR illustrated. A primary surface 13a of a substrate 13 faces in the direction of Z-axis and extends in X-direction and Y-direction. The X-axis is directed along the direction of a-axis.

As shown in part (a) of FIG. 1, the Group III nitride semiconductor device 11 has the substrate 13, an n-type Group III nitride semiconductor epitaxial region (hereinafter referred to as "n-type Group III semiconductor region") 15, a light emitting layer 17, and a p-type Group III nitride semiconductor epitaxial region (hereinafter referred to as "p-type Group III nitride semiconductor region") 19. The substrate 13 has the primary surface 13a comprising a first gallium nitride based semiconductor and exhibits electrical conductivity. The primary surface 13a of the substrate 13 is inclined at an angle in the range of not less than 50 degrees, and less than 130 degrees from a plane Sc perpendicular to a reference axis Cx which extends along the c-axis of the first gallium nitride based semiconductor. The n-type Group III nitride semiconductor region 15 includes one or more n-type gallium nitride based semiconductor layers and can be provided on the primary surface 13a. The n-type Group III nitride semiconductor region 15 can include, for example, an n-type buffer layer, an n-type cladding layer, and an n-type optical guiding layer. The p-type Group III nitride semiconductor region 19 can include one or more p-type gallium nitride based semiconductor layers. The p-type Group III nitride semiconductor region 19 includes, for example, a first p-type gallium nitride based semiconductor layer 21 and is provided above the primary surface 13a. An oxygen concentration of the first p-type gallium nitride based semiconductor layer 21 is not more than $5\times10^{17}$ cm$^{-3}$. A concentration ratio (Noxg/Npd) of the oxygen concentration Noxg to a p-type dopant concentration Npd of the first p-type gallium nitride based semiconductor layer 21 is not more than 1/10. In the present example the Group III nitride semiconductor region 19 can include a second p-type gallium nitride based semiconductor layer 23. The p-type Group III nitride semiconductor region 19 can include, for example, a p-type electron blocking layer, a p-type optical guiding layer, a p-type cladding layer, and a p-type contact layer.

In this Group III nitride semiconductor device 11, the first p-type gallium nitride based semiconductor layer 21 is provided above the primary surface 13a of the substrate 13. This primary surface 13a is inclined at the angle in the range of not less than 50 degrees and less than 130 degrees with respect to the plane Sc perpendicular to the reference axis Cx. Since the oxygen concentration in the first p-type gallium nitride based semiconductor layer 21 is not more than $5\times10^{17}$ cm$^{-3}$, it is feasible to reduce the phenomenon in which the p-type dopant in the first p-type gallium nitride based semiconductor layer 21 is compensated by oxygen contained in the first p-type gallium nitride based semiconductor layer 21. Since the concentration ratio (Noxg/Npd) is not more than 1/10, the p-type dopant concentration Npd can be made lowered.

The first and second p-type gallium nitride based semiconductor layers 21, 23 can comprise GaN, InGaN, AlGaN, or InAlGaN. In the present example, the oxygen concentration is reduced and the concentration ratio (Noxg/Npd) is reduced to not more than 1/10 in GaN, InGaN, AlGaN, or InAlGaN grown on the Group III nitride semiconductor surface which is not the polar plane.

The first p-type gallium nitride based semiconductor layer 21, preferably, does not contain indium as a Group III constituent element. This makes it feasible to reduce the oxygen concentration and makes it possible to lower the p-type dopant concentration Npd in the gallium nitride semiconductor not containing indium as a Group III constituent element. In a further preferred example, the first p-type gallium nitride based semiconductor layer 21 can be comprised of GaN or AlGaN. The oxygen concentration is reduced and the concentration ratio (Noxg/Npd) is reduced to not more than 1/10 in GaN or AlGaN grown on the Group III nitride semiconductor surface which does not correspond to the polar plane.

On the other hand, the second p-type gallium nitride based semiconductor layer 23 preferably contains indium as a Group III constituent element. This makes it feasible to reduce the oxygen concentration and can lower the p-type dopant concentration Npd in the gallium nitride based semiconductor containing indium as a Group III constituent element. The oxygen concentration in the second p-type gallium nitride based semiconductor layer 23 can be not more than $5\times10^{17}$ cm$^{-3}$. The second p-type gallium nitride based semiconductor layer 23 can contain indium as a Group III constituent element and can comprise, for example, InGaN or InAlGaN. In the second p-type gallium nitride based semiconductor layer 23, a concentration ratio (Noxg/Npd) of the oxygen concentration Noxg to the p-type dopant concentration Npd can be not more than 1/10. The oxygen concentration can also be reduced and accordingly the concentration ratio (Noxg/Npd) can also be reduced to not more than 1/10 in the p-type gallium nitride based semiconductor layer 23 containing indium as a Group III constituent element. Therefore, it is feasible to improve the characteristics of this p-type Group III nitride semiconductor.

In the first and second p-type gallium nitride based semiconductor layers 21, 23, magnesium (Mg) or zinc (Zn) can be used as the p-type dopant, and the p-type dopant concentration is preferably, for example, not less than $1\times10^{18}$ cm$^{-3}$ because the doping concentration of less than this value increases the resistance and thus degrades the electrical characteristics. The p-type dopant concentration is preferably, for example, not more than $5\times10^{19}$ cm$^{-3}$ because the doping concentration of more than this value degrades the crystallinity and electrical characteristics. The p-type dopant concentration in these layers 21, 23 can be made smaller than that in a p-type contact layer 25.

In the present embodiment a p-type Group III nitride semiconductor lamination 26 includes two layers of the first and second p-type gallium nitride based semiconductor layers 21, 23. The p-type Group III nitride semiconductor lamination 26 makes a first junction J1 with the contact layer 25 and a second junction J2 with the light emitting layer 17. As understood from the above description, the oxygen concentration is preferably not more than $5\times10^{17}$ cm$^{-3}$ throughout the whole of the p-type Group III nitride semiconductor lamination 26. The concentration ratio (Noxg/Npd) of the oxygen concentration Noxg to the p-type dopant concentration Npd in the Group III nitride semiconductor lamination 26 can be not more than 1/10. The oxygen concentration is reduced and the ratio (Noxg/Npd) is reduced to not more than 1/10 in the whole Group III nitride semiconductor region 26 except for the p-type semiconductor region 25 having the higher dopant concentration. It can improve the electrical characteristics of the p-type Group III nitride semiconductor, which forms a current path from an anode.

A carbon concentration of the first p-type gallium nitride based semiconductor layer 21 can be not more than $1\times10^{17}$ cm$^{-3}$. Particularly, in fabrication of a light emitting device of a long wavelength, the growth temperature of p-semiconductor layer needs to be set lower, and this leads to increase in the concentration of carbon impurity. According to Inventors' knowledge, it is feasible to reduce not only the oxygen concentration but also the carbon concentration of the first p-type gallium nitride based semiconductor layer 21 in the growth using a nitrogen atmosphere. Particularly, in fabrication of a light emitting device of a long wavelength, the growth temperature of p-semiconductor layer is made reduced, and this leads to increase in the concentration of carbon impurity. According to Inventors' knowledge, it is feasible to reduce not only the oxygen concentration but also the carbon concentration in the second p-type gallium nitride based semiconductor layer 23 grown in a nitrogen atmosphere. The carbon concentration of the second p-type gallium nitride based semiconductor layer 23 can be not more than $1\times10^{17}$ cm$^{-3}$.

The substrate 13 comprises a first gallium nitride based semiconductor and can be made, for example, of GaN, InGaN, or AlGaN. Since GaN is a gallium nitride based semiconductor being a binary compound, it can provide the substrate with excellent crystal quality and a stable primary surface. Furthermore, the first gallium nitride based semiconductor can be made, for example, of AlN.

A c-plane of the substrate 13 extends along the plane Sc shown in FIG. 1. On the plane Sc, the coordinate system CR (c-axis, a-axis, and m-axis) is illustrated in order to indicate the crystal axes of a hexagonal gallium nitride based semiconductor. The primary surface 13a of the substrate 13 is inclined at the inclination angle α toward the direction of the m-axis or the a-axis of the first gallium nitride based semiconductor with respect to the plane perpendicular to the reference axis Cx. The inclination angle α is defined by an angle between a vector VN normal to the primary surface 13a of the substrate 13 and a c-axis vector VC representing the reference axis Cx. On the primary surface 13a, the active layer 17 is provided between the n-type gallium nitride based semiconductor region 15 and the p-type gallium nitride based semiconductor region 19, and the n-type gallium nitride based semiconductor region 15, active layer 17, and p-type gallium nitride based semiconductor region 19 are arranged in the direction of the normal axis Ax.

In a preferred example, the range of inclination angle α can be separated into a first angle range of plane orientation exhibiting the feature of semi-polarity and a second angle range of plane orientation exhibiting the feature close to non-polarity. The first angle range is, for example, not less than 50 degrees and not more than 80 degrees and, not less than 100 degrees and less than 130 degrees. In the first angle range, the plane orientation thereof has an advantage of enhancement of crystallinity, particularly, of InGaN with a high In composition, and in the second angle range, the plane orientation thereof has an advantage of suppression of a piezoelectric field, particularly, in InGaN with a high In composition.

The light emitting layer 17 includes an active layer 27 and can include an n-side optical guiding layer 29 and a p-side optical guiding layer 31, if necessary. The active layer 27 includes at least one semiconductor epitaxial layer 33. The semiconductor epitaxial layer 33 is provided above the gallium nitride semiconductor epitaxial region 15. The semiconductor epitaxial layer 33 comprises, for example, AlGaN, GaN, InGaN, or InAlGaN and can be made of a second gallium nitride based semiconductor which contains indium. The active layer 27 can include another semiconductor epitaxial layer 35. The other semiconductor epitaxial layer 35 can comprise, for example, AlGaN, GaN, InGaN, or InAlGaN, and can be made of a third gallium nitride semiconductor which contains indium. The other semiconductor epitaxial layer 35 has the bandgap larger than that of the semiconductor epitaxial layer 33. In an example, the semiconductor epitaxial layer 33 serves as a well layer and the semiconductor epitaxial layer 35 as a barrier layer. The active layer 27 can have a single or multiple quantum well structure.

The emission wavelength of the light emitting layer 17 (active layer 27) can be, for example, not less than 440 nm and not more than 600 nm. In the light emitting device to emit light in the foregoing emission wavelength range, it has improved electrical characteristics of the p-type gallium nitride semiconductor. The emission wavelength of the light emitting layer 17 (active layer 27) can be not less than 490 nm and not more than 600 nm. In the light emitting device to provide emission of light at a long wavelength, it has improved characteristics of the p-type gallium nitride semiconductor.

The below provides an example in the present embodiment.
Semiconductor layer 15: n-type InAlGaN cladding layer.
Semiconductor layer 21: p-type GaN electron blocking layer.
Semiconductor layer 23: p-type InAlGaN cladding layer.
Semiconductor layer 25: p-type GaN contact layer.
Semiconductor layer 29: n-side undoped InGaN optical guiding layer.
Semiconductor layer 31: p-side undoped InGaN optical guiding layer.

If necessary, the n-type Group III nitride semiconductor region 15 can include an n-side optical guiding layer 29 and an n-type optical guiding layer and the p-type Group III nitride semiconductor region 19 can include a p-side optical guiding layer 31 and a p-type optical guiding layer.

The epitaxial substrate EP for the Group III nitride semiconductor device 11 includes semiconductor layers (semiconductor films) corresponding to these semiconductor layers and the above description for the Group III nitride semiconductor device 11 applies to the corresponding semiconductor layers. The surface roughness of this epitaxial substrate EP is not more than 1 nm in an arithmetic average roughness. The Group III nitride semiconductor device 11 can include a first electrode 37 (e.g., an anode) provided on the contact layer 25, and the first electrode 37 makes contact JC with the p-type Group III nitride semiconductor region 19 (contact layer 25) through an aperture 39a in an insulating film 39 which covers the contact layer 25. The electrode can be comprised, for example, of Ni/Au. The Group III nitride semiconductor device 11 can include a second electrode 41 (e.g., a cathode) provided on a back surface 13b of the substrate 13, and the second electrode 41 is comprised, for example, of Ti/Al.

Figure 2:
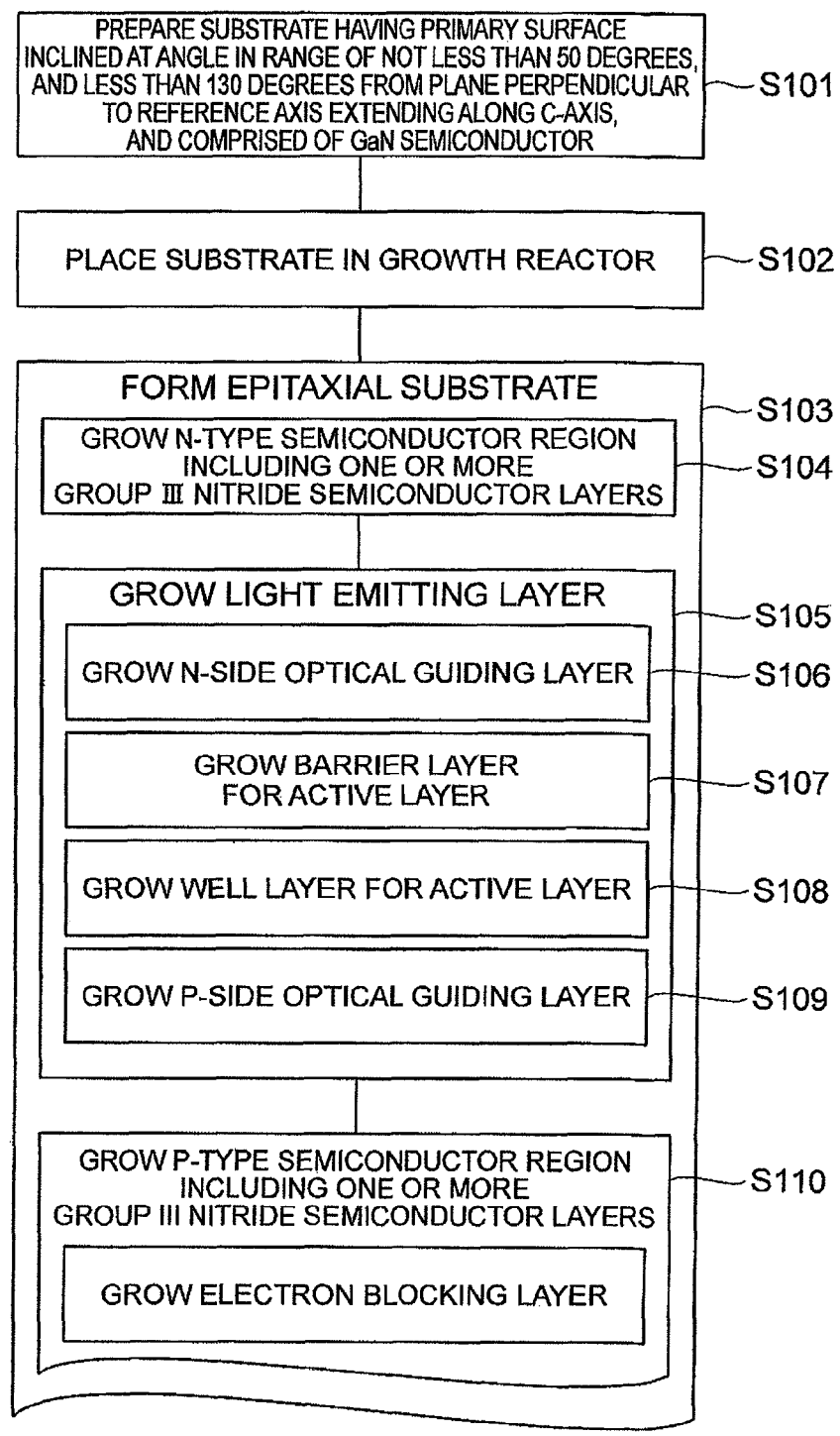
FIG. 2 is a drawing showing major steps in a method for fabricating the Group III nitride semiconductor device and the epitaxial substrate, according to the embodiment.
Figure 3:
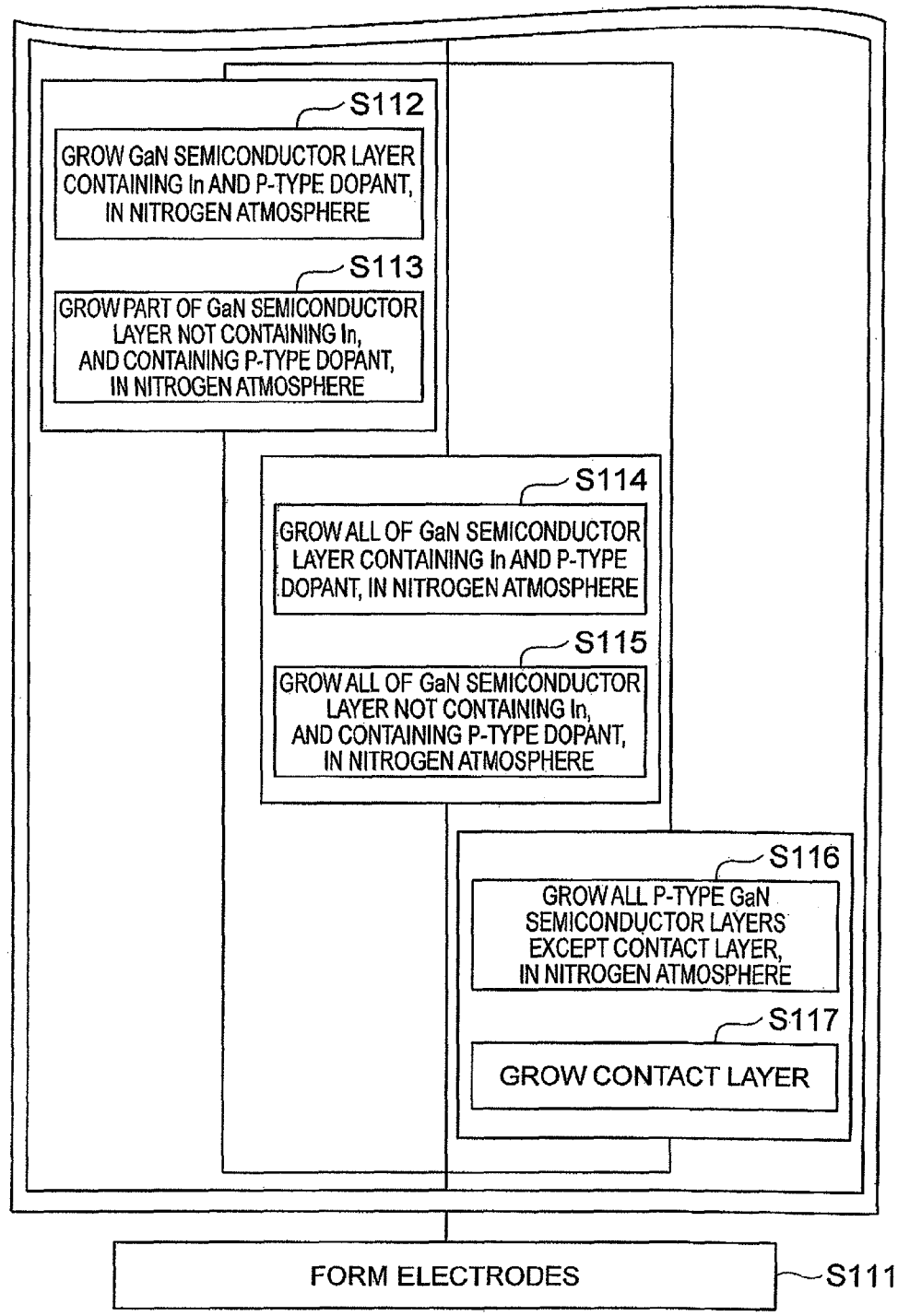
FIG. 3 is a drawing showing major steps in the method for fabricating the Group III nitride semiconductor device and the epitaxial substrate, according to the embodiment.
Figure 4:
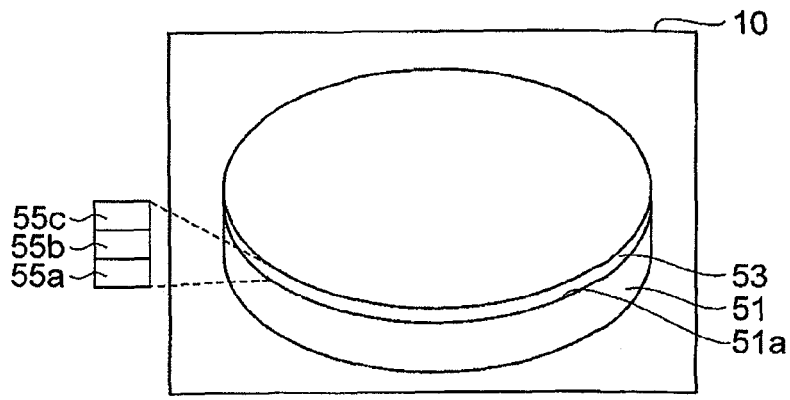
FIG. 4 is a drawing schematically showing products in major steps in the method for fabricating the Group III nitride semiconductor device and the epitaxial substrate, according to the embodiment.
Figure 4:
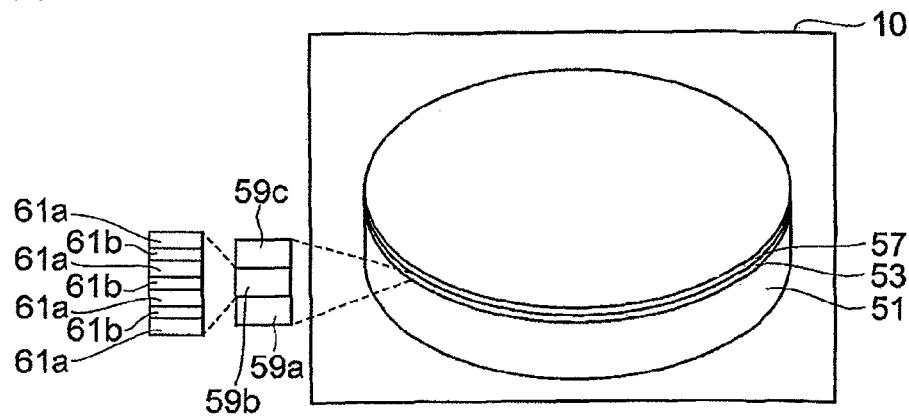
Figure 4:
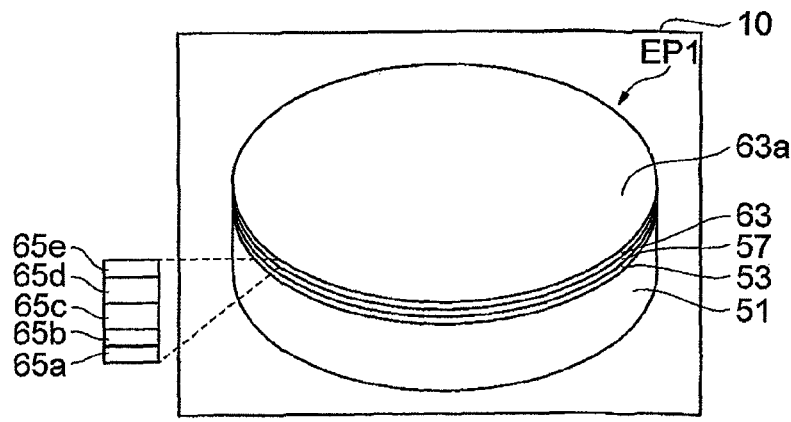
Figure 5:
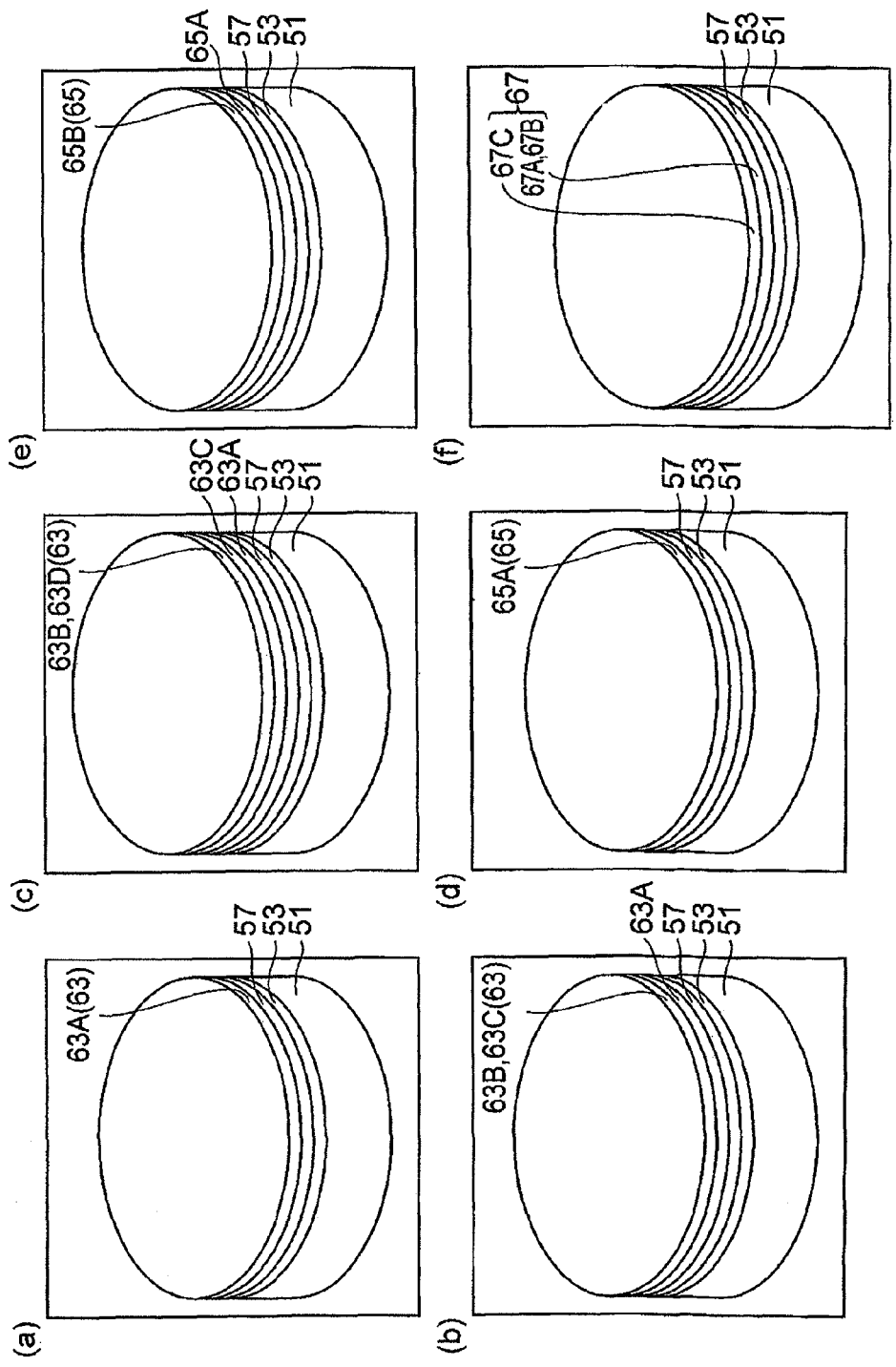
FIG. 5 is a drawing schematically showing products in major steps in the method for fabricating the Group III nitride semiconductor device and the epitaxial substrate, according to the embodiment.

FIGS. 2 and 3 are drawings showing major steps in a method for fabricating the Group III nitride semiconductor device and the epitaxial substrate, according to the present embodiment. FIGS. 4 and 5 are drawings schematically showing products in principal steps in the method for fabricating the Group III nitride semiconductor device and the epitaxial substrate, according to the present embodiment.

According to the step flow shown in FIGS. 2 and 3, the epitaxial substrate and the Group III nitride semiconductor optical device of the structure of a light emitting device are fabricated on a substrate by metal organic vapor phase epitaxy. Raw materials for epitaxial growth used herein are as follows: trimethylgallium (TMG), trimethylindium (TMI); trimethylaluminum (TMA); ammonia ($NH_3$); silane ($SiH_4$); and bis(cyclopentadienyl)magnesium ($Cp_2Mg$).

In step S101, a substrate with a primary surface (substrate 51 shown in part (a) of FIG. 4) is prepared, which is made of a gallium nitride based semiconductor. A normal axis to the primary surface of the substrate 51 has an inclination angle in the angle range of 50 degrees to 130 degrees with respect to the c-axis of the gallium nitride based semiconductor. In the present example, the substrate 51 has the primary surface inclined at the angle of 75 degrees from the c-plane toward the m-axis direction in hexagonal GaN, and this inclined surface is represented by {20-21} plane. The primary surface is mirror polished.

Epitaxial growth is carried out under the below conditions on the substrate 51. First, in step S102, the substrate 51 is loaded in a growth reactor 10. In the growth reactor 10, for example, a quartz jig such as a quartz flow channel is placed. If necessary, the substrate is thermally treated at the temperature of 1050 degrees Celsius and the inreactor pressure of 27 kPa for ten minutes while supplying a thermal treatment gas containing $NH_3$ and $H_2$ into the growth reactor 10. This thermal treatment results in surface modification.

After this thermal treatment, in step S103, Group III nitride semiconductor layers is grown on the substrate 51 to form the epitaxial substrate. First, in step S104, a source gas containing raw materials for a Group III constituent element and a Group V constituent element, and an n-type dopant, and an atmosphere gas are supplied into the growth reactor 10 to epitaxially grow a Group III nitride semiconductor region 53. An inclination angle of a primary surface 53a of the Group III nitride semiconductor region 53 is associated with the inclination angle of the primary surface 51a of the substrate 51. The Group III nitride semiconductor region 53 can include one or more Group III nitride semiconductor layers. The atmosphere gas includes a carrier gas and a sub-flow gas. The atmosphere gas can contain, for example, nitrogen and/or hydrogen. In the present example, the following gallium nitride based semiconductor region is grown. At 950 degrees Celsius, TMG, $NH_3$, $SiH_4$, and nitrogen and/or hydrogen are supplied into the growth reactor 10 to grow a Si-doped GaN layer 55a. Then, at the substrate temperature of 870 degrees Celsius, TMG, TMI, TMA, $NH_3$, $SiH_4$, and nitrogen are supplied into the growth reactor 10 to grow a Si-doped InAlGaN layer 55b. Thereafter, at 1050 degrees Celsius, TMG, $NH_3$, $SiH_4$, and nitrogen and/or hydrogen are supplied into the growth reactor 10 to grow a Si-doped GaN layer 55c. The hydrogen atmosphere of reducibility facilitates oxygen to desorb from the jig in the growth reactor and deposits on this jig.

In step S105, a light emitting layer 57 is grown thereon. In this step, first, step S106 is carried out to supply TMG, TMI, $NH_3$, and nitrogen into the growth reactor at the substrate temperature of 870 degrees Celsius to grow an InGaN optical guiding layer 59a. A part or the whole of the optical guiding layer 59a can be undoped or n-type conductive.

Next, an active layer 59b is grown. In the growth of the active layer 59b, step S107 is carried out to supply TMG, TMI, $NH_3$, and atmosphere gas of nitrogen into the growth reactor to grow an undoped InGaN barrier layer 61a. The thickness of the InGaN layer 61a is 15 nm. After this growth, semiconductor growth is interrupted and the substrate temperature is changed from the growth temperature of the barrier layer to the growth temperature of the well layer. After the change, in step S108, TMG, TMI, $NH_3$, and atmosphere gas of nitrogen supplied into the growth reactor 10 to grow an undoped InGaN well layer 61b. The thickness of the InGaN well layer 61b can be 3 nm. If needed, the barrier layer growth, the temperature change, and the well layer growth can be repeatedly carried out and in the present example, the quantum well layer includes three well layers. In step S109, TMG, TMI, $NH_3$, and atmosphere gas of nitrogen is supplied into the growth reactor 10 at the substrate temperature of 870 degrees Celsius to grow an InGaN optical guiding layer 59c. A part or the whole of the optical guiding layer 59c can be undoped or p-type conductive. Inclination angles of primary surfaces of the light emitting layer 57 and active layer 59b are associated with the inclination angle of the primary surface 51a of the substrate 51.

Step S110 is to supply a source gas containing a Group III raw material, a Group V raw material, and a p-type dopant, and an atmosphere gas into the growth reactor 10 to epitaxially grow a Group III nitride semiconductor region 63. An inclination angle of a primary surface 63a of the Group III nitride semiconductor region 63 corresponds to the inclination angle of the primary surface 51a of the substrate 51. The Group III nitride semiconductor region 63 can include one or more Group III nitride semiconductor layers. In the present example, the gallium nitride based semiconductor region is grown, which will be described below.

For example, after the growth of the light emitting layer 57, the supply of TMG is terminated and then the substrate temperature is raised. TMG, NH$_3$, Cp$_2$Mg, and atmosphere gas are supplied into the growth reactor to grow a p-type GaN electron blocking layer 65a at the substrate temperature of 840 degrees Celsius. In this growth, it is preferable to supply nitrogen as atmosphere gas. Next, TMG, TMI, NH$_3$, Cp$_2$Mg, and nitrogen are supplied into the growth reactor 10 to grow a Mg-doped InGaN optical guiding layer 65b at the substrate temperature of 840 degrees Celsius. After this, at 840 degrees Celsius, TMG, NH$_3$, Cp$_2$Mg, and atmosphere gas are supplied into the growth reactor 10 to grow a Mg-doped GaN optical guiding layer 65c. In this growth, it is preferable to supply nitrogen as atmosphere gas. Then, at the substrate temperature of 870 degrees Celsius, TMG, TMI, TMA, NH$_3$, Cp$_2$Mg, and nitrogen are supplied into the growth reactor 10 to grow a Mg-doped InAlGaN cladding layer 65d. Then, at 870 degrees Celsius, TMG, NH$_3$, Cp$_2$Mg, and atmosphere gas are supplied into the growth reactor 10 to grow a high-concentration Mg-doped GaN contact layer 65e. In this growth, it is preferable to supply nitrogen as atmosphere gas. After these steps, the epitaxial substrate EP1 is obtained.

In step S111, electrodes are formed on the epitaxial substrate EP1. The formation of electrodes is carried out as follows. For example, an electrode (Ni/Au) is formed on the p-type GaN contact layer 65e and an electrode (Ti/Al) is formed on a back surface of the epitaxial substrate EP1. Prior to the formation of electrodes, a ridge structure can be formed by processing the epitaxial substrate EP1.

The epitaxial growth of the p-type Group III nitride semiconductor region 63 in step S110 can be carried out in the below-described manner, as shown in FIG. 5.

In an example, the Group III nitride semiconductor region 63 can include one or more p-type gallium nitride based semiconductor layers containing indium as a Group III constituent element (which will be referred to as "p-type gallium nitride based semiconductor layer 63A"), and/or, one or more p-type gallium nitride based semiconductor layers not containing indium as a Group III constituent element (which will be referred to as "p-type gallium nitride based semiconductor layer 63B"). As shown in part (a) of FIG. 5, in step S112, all of the p-type gallium nitride based semiconductor layers 63A are formed in a nitrogen atmosphere. By each growth, an oxygen concentration of the p-type gallium nitride based semiconductor layers 63A become not more than $5\times10^{17}$ cm$^{-3}$ and a ratio (Noxg/Npd) of the oxygen concentration Noxg to a p-type dopant concentration Npd of the p-type gallium nitride based semiconductor layers 63A becomes not more than 1/10. As shown in part (b) of FIG. 5, step S113 is a step of forming a partial layer 63C, which is a part of the p-type gallium nitride based semiconductor layer 63B, in a nitrogen atmosphere. By this growth, an oxygen concentration of the p-type gallium nitride based semiconductor layer 63C becomes not more than $5\times10^{17}$ cm$^{-3}$ and a ratio (Noxg/Npd) of the oxygen concentration Noxg to a p-type dopant concentration Npd of the p-type gallium nitride based semiconductor layer 63C becomes not more than 1/10. As shown in part (c) of FIG. 5, the subsequent step is carried out to form a remaining layer 63D, which is a part of the p-type gallium nitride based semiconductor layer 63B, in a hydrogen atmosphere. In the growth of the Group III nitride semiconductor region 63, the arrangement of growth steps of the layers 63A, 63C, and 63D can be changed.

In another example, a Group III nitride semiconductor region 65 can include one or more p-type gallium nitride based semiconductor layers containing indium as a Group III constituent element (which will be referred to as "p-type gallium nitride based semiconductor layers 65A"), and one or more p-type gallium nitride based semiconductor layers not containing indium as a Group III constituent element (which will be referred to as "p-type gallium nitride based semiconductor layers 65B"). As shown in part (d) of FIG. 5, in step S114, the whole of the p-type gallium nitride based semiconductor layer 65A is formed in a nitrogen atmosphere. By this growth, an oxygen concentration of the p-type gallium nitride based semiconductor layer 65A is made not more than $5\times10^{17}$ cm$^{-3}$ and a ratio (Noxg/Npd) of the oxygen concentration Noxg to a p-type dopant concentration Npd of the p-type gallium nitride based semiconductor layer 65A is made not more than 1/10. Furthermore, as shown in part (e) of FIG. 5, in step S115, the p-type gallium nitride based semiconductor layer 65B is formed in a nitrogen atmosphere. By this growth, an oxygen concentration of the p-type gallium nitride based semiconductor layer 65B is made not more than $5\times10^{17}$ cm$^{-3}$ and a ratio (Noxg/Npd) of the oxygen concentration Noxg to a p-type dopant concentration Npd of the p-type gallium nitride based semiconductor layer 65B is made not more than 1/10. In the growth of the Group III nitride semiconductor region 65, the arrangement of growth steps of the layers 65A and 65B can be changed.

In still another example, a Group III nitride semiconductor region 67 can include one or more p-type gallium nitride based semiconductor layers containing indium as a Group III constituent element (which will be referred to as "p-type gallium nitride based semiconductor layers 67A"), one or more p-type gallium nitride based semiconductor layers not containing indium as a Group III constituent element (which will be referred to as "p-type gallium nitride based semiconductor layers 67B"), and a p-type contact layer 67C. As shown in part (f) of FIG. 5, in step S116, the whole of the p-type gallium nitride based semiconductor layers 67A is formed in a nitrogen atmosphere and the whole of the p-type gallium nitride based semiconductor layers 67B is formed in a nitrogen atmosphere. By the growth of the p-type gallium nitride based semiconductor layers 67A, 67B in the nitrogen atmosphere, oxygen concentrations of these layers 67A, 67B are made not more than $5\times10^{17}$ cm$^{-3}$, and ratios (Noxg/Npd) of the oxygen concentrations Noxg to p-type dopant concentrations Npd of these layers 67A, 67B are made not more than 1/10. In step S117, the p-type gallium nitride based semiconductor contact layer 67C is formed thereon. This contact layer 67C can also be formed in a nitrogen atmosphere and this growth can make an oxygen concentration of the contact layer 67C not more than $5\times10^{17}$ cm$^{-3}$.

The source gas for the Group III and Group V constituent elements, and the atmosphere gas are supplied into the quartz tube of the growth reactor. In the growth of the p-type gallium nitride based semiconductor layer not containing indium as a Group III constituent element, the rate of the atmosphere gas (atmosphere gas/(atmosphere gas+source gas)) can be not less than 60%. The percentage herein is percent in volume. Examples in the present embodiment will be described below.

Example 1

A laser diode is fabricated in the device structure shown in part (a) of FIG. 6. In part (b) of FIG. 6, atmosphere gases are shown for respective constituent layers of an epitaxial structure. A {20-21}-plane GaN substrate is prepared. An epitaxial lamination is formed on this GaN substrate by metal organic vapor phase epitaxy. In growth of p-type gallium nitride based semiconductor layers, growth of each gallium nitride based semiconductor layer not containing indium (In) is carried out in a hydrogen atmosphere made with supply of only hydrogen as atmosphere gas. Growth of each gallium nitride based semiconductor layer containing indium (In) is carried out in a nitrogen atmosphere made with supply of only nitrogen as atmosphere gas. An insulating film (silicon oxide film) having a stripe window with the width of 10 μm is formed on the epitaxial lamination. A Pd electrode as an anode electrode is formed by evaporation. After this formation, a pad electrode is formed by evaporation. The substrate product obtained in this manner is separated at an interval of 600 μm to produce a laser bar. A reflecting film of a dielectric multilayer film is deposited on each of end faces for the optical cavity of the laser bar. The dielectric multilayer film comprises $SiO_2/TiO_2$. The reflectance of the front end face is made 80% and the reflectance of the rear end face is made 95%. The laser diode lases at the wavelength of 520 nm with the threshold current of 4 $kA/cm^2$ and its operating voltage is 8.5 V.

With reference to part (b) of FIG. 6, the magnesium concentration, oxygen concentration, and O/Mg ratio thereof (oxygen concentration/magnesium concentration) are shown. In part (b) of FIG. 6, for example, "3e20" represents $3 \times 10^{20}$.

The gallium nitride based semiconductor layers containing indium (In), e.g., p-type InGaN and p-type InAlGaN are grown in the nitrogen atmosphere made with supply of only nitrogen as atmosphere gas, and the oxygen concentrations thereof are not more than $5 \times 10^{17}$ $cm^{-3}$. The O/Mg ratios are not more than 0.1. Regarding the film formation condition thereof, the V/III ratio of approximately 5000 to 10000 is used. On the other hand, the oxygen concentrations are high in the growth of the p-type gallium nitride based semiconductor layers formed with supply of only hydrogen as atmosphere gas (gallium nitride based semiconductor layers not containing indium (In)).

Example 2

A laser diode is fabricated in the device structure shown in part (a) of FIG. 7. In part (b) of FIG. 7, atmosphere gases are shown for respective constituent layers of an epitaxial structure. A {20-21}-plane GaN substrate is prepared. An epitaxial lamination is formed on this GaN substrate by metal organic vapor phase epitaxy. In growth of p-type gallium nitride based semiconductor layers, growth of each gallium nitride based semiconductor layer not containing indium (In) is carried out in an atmosphere formed with supply of nitrogen or hydrogen as atmosphere gas. Growth of each gallium nitride based semiconductor layer containing indium (In) is carried out in an atmosphere formed with supply of only nitrogen as atmosphere gas. In the same manner as in Example 1, the insulating film, anode electrode, etc. are produced on the epitaxial lamination to obtain a substrate product. This substrate product is separated at an interval of 600 μm to obtain laser bars. In the same manner as in Example 1, the reflecting film comprising the dielectric multilayer film is deposited on each of end faces for the optical cavityx of the laser bar. The laser diode lases at the wavelength of 520 nm with the threshold current of 4 $kA/cm^2$ and its operating voltage is 8.0 V.

With reference to part (b) of FIG. 7, the magnesium concentration, oxygen concentration, and O/Mg ratio thereof (oxygen concentration/magnesium concentration) are shown.

The gallium nitride based semiconductor layers containing indium (In), e.g., p-type InGaN and p-type InAlGaN, are grown in the nitrogen atmosphere formed with supply of only nitrogen as atmosphere gas, and the O/Mg ratios are not more than 0.1. In the film formation condition thereof, the V/III ratio of approximately 5000 to 10000 is used.

The gallium nitride based semiconductor layer not containing indium (In), e.g., the p-type GaN optical guiding layer, is grown with supply of only nitrogen as atmosphere gas, whereas the other gallium nitride based semiconductor layers not containing indium (In), e.g., the p+ type GaN contact layer and the p-type GaN electron blocking layer, are grown in a hydrogen atmosphere. In the growth of the p-type GaN layer formed with supply of only nitrogen as atmosphere gas, the oxygen concentration is low and the O/Mg ratio is not more than 0.1.

However, the oxygen concentrations are high in the growth of the p-type GaN electron blocking layer and p+ GaN contact layer formed with supply of only hydrogen as atmosphere gas.

Example 3

A laser diode is fabricated in the device structure shown in part (a) of FIG. 8. In part (b) of FIG. 8, atmosphere gases are shown for respective constituent layers of an epitaxial structure. A {20-21}-plane GaN substrate is prepared. An epitaxial lamination is formed on this GaN substrate by metal organic vapor phase epitaxy. In growth of p-type gallium nitride based semiconductor layers, growth of each gallium nitride based semiconductor layer not containing indium (In) is carried out in an atmosphere formed with supply of nitrogen or hydrogen as atmosphere gas. Growth of each gallium nitride based semiconductor layer containing indium (In) is carried out in a nitrogen atmosphere formed with supply of only nitrogen as atmosphere gas. In the same manner as in Example 1, the insulating film, anode electrode, etc. are produced on the epitaxial lamination to obtain a substrate product. This substrate product is separated at an interval of 600 μm to obtain a laser bar. In the same manner as in Example 1, the reflecting film of the dielectric multilayer film is deposited on each of end faces for the optical cavity of the laser bar. The laser diode lases at the wavelength of 520 nm with the threshold current of 4 $kA/cm^2$ and its operating voltage is 7.5 V.

With reference to part (b) of FIG. 8, the magnesium concentration, oxygen concentration, and O/Mg ratio thereof (oxygen concentration/magnesium concentration) are shown. The gallium nitride based semiconductor layers containing indium (In), e.g., p-type InGaN and p-type InAlGaN are grown in a nitrogen atmosphere formed with supply of only nitrogen as atmosphere gas, and the O/Mg ratios thereof are not more than 0.1. The gallium nitride based semiconductor layers not containing indium (In), e.g., the p-type GaN optical guiding layer and the p-type GaN electron blocking layer, are grown with supply of only nitrogen as atmosphere gas, whereas the other gallium nitride based semiconductor layer not containing indium (In), e.g., the p+ type GaN contact layer, is grown in a hydrogen atmosphere. In the growth of the p-type GaN optical guiding layer and the p-type electron blocking layer formed with supply of only nitrogen as atmosphere gas, the oxygen concentrations thereof are low and the O/Mg ratios are not more than 0.1. In the film formation condition thereof, the V/III ratio of approximately 5000 to 10000 is used. However, the oxygen concentration is high in the growth of the p+ GaN contact layer formed with supply of only hydrogen as atmosphere gas.

Example 4

A laser diode is fabricated in the device structure shown in part (a) of FIG. 9. In part (b) of FIG. 9, atmosphere gases are shown for respective constituent layers of an epitaxial structure. A {20-21}-plane GaN substrate is prepared. An epitaxial lamination is formed on this GaN substrate by metal organic vapor phase epitaxy. In growth of p-type gallium nitride based semiconductor layers, growth of each gallium nitride based semiconductor layer not containing indium (In) is carried out in a nitrogen atmosphere formed with supply of only nitrogen as atmosphere gas. Growth of each gallium nitride based semiconductor layer containing indium (In) is carried out in a nitrogen atmosphere formed with supply of only nitrogen as atmosphere gas. In the same manner as in Example 1, the insulating film, anode electrode, etc. are produced on the epitaxial lamination to obtain a substrate product. This substrate product is separated at an interval of 600 µm to obtain a laser bar. In the same manner as in Example 1, the reflecting film comprised of the dielectric multilayer film is deposited on each of end faces for the optical cavity of the laser bar. The laser diode lases at the wavelength of 520 nm with the threshold current of 4 kA/cm$^2$ and its operating voltage is 7.0 V.

With reference to part (b) of FIG. 9, the magnesium concentration, oxygen concentration, and O/Mg ratio thereof (oxygen concentration/magnesium concentration) are shown. The gallium nitride based semiconductor layers containing indium (In), e.g., p-type InGaN and p-type InAlGaN, are grown in the nitrogen atmosphere formed with supply of only nitrogen as atmosphere gas, and the O/Mg ratios thereof are not more than 0.1. Regarding the film formation condition thereof, the V/III ratio of approximately 5000 to 10000 is used. The gallium nitride based semiconductor layers not containing indium (In), e.g., the p-type GaN optical guiding layer, the p-type GaN electron blocking layer, and the p+ GaN contact layer, are formed with supply of only nitrogen as atmosphere gas, and thus the growth of all the p-type gallium nitride based semiconductor layers is carried out in the nitrogen atmosphere. The oxygen concentrations are made low and the O/Mg ratios made are not more than 0.1 in the growth of the p-type GaN optical guiding layer, p-type GaN electron blocking layer, and p+ GaN contact layer formed with supply of only nitrogen as atmosphere gas.

Example 5

A laser diode is fabricated in the device structure shown in part (a) of FIG. 10. In part (b) of FIG. 10, atmosphere gases are shown for respective constituent layers of an epitaxial structure. A {20-21}-plane GaN substrate is prepared. An epitaxial lamination is formed on this GaN substrate by metal organic vapor phase epitaxy. The growth of the gallium nitride based semiconductor layers not containing indium (In) and the growth of the gallium nitride based semiconductor layers containing indium (In) are carried out in a nitrogen atmosphere formed with supply of only nitrogen as atmosphere gas. The surface roughness of the epitaxial substrate is not more than 1 nm in arithmetic average roughness. In the same manner as in Example 1, the insulating film, anode electrode, etc. are produced on the epitaxial lamination to obtain a substrate product. This substrate product is separated at an interval of 600 µm to obtain a laser bar. In the same manner as in Example 1, the reflecting film comprised of the dielectric multilayer film is deposited on each of end faces for the optical cavity of the laser bar. The laser diode lases at the wavelength of 520 nm with the threshold current of 4 kA/cm$^2$ and its operating voltage is 6.5 V.

The p-type and n-type gallium nitride based semiconductor layers are grown with supply of only nitrogen as atmosphere gas. The oxygen concentrations are low, and the O/Mg ratios are not more than 0.1 in the growth of the gallium nitride based semiconductor layers formed with supply of only nitrogen as atmosphere gas.

The technical contributions as described below are also achieved in addition to the reduction of driving voltage. For example, the number of switching of carrier gas is reduced, so as to reduce dusts such as particles produced during the growth. Furthermore, impurities decrease at interfaces. Since the nitrogen carrier gas is used, the epitaxial surfaces become flattened, so as to improve the surface morphology. This improves the chip yield and device reliability. Furthermore, it is feasible to lower the growth temperature of the p-type semiconductor layers and thus to reduce deterioration of the well layer during the growth of the p-type semiconductor layers.

As understood from the results of Examples 1 to 5, irrespective of whether indium (In) is included or not, the O/Mg ratio is not more than 0.1 in the growth of a p-type gallium nitride based semiconductor layer(s), which is grown in the nitrogen atmosphere formed with supply of only nitrogen as atmosphere gas, among the p-type gallium nitride based semiconductor layers.

The inventors carry out a number of trials to reduce the oxygen concentration, such as selection of high-purity raw materials, cleaning of the substrate before the epitaxial growth, and cleaning of the jig, but any of them has achieved no satisfactory effect.

According to Inventors' research, as polar plane of a c-plane is compared with semipolar plane, the semipolar plane demonstrates incorporation of oxygen about one figure higher than the c-plane. For this reason, incorporation of oxygen impurity in the growth onto the c-plane does not significantly affect the quality of the epitaxially grown film. However, it can be a cause to degrade, particularly, the electrical characteristics of the p-type semiconductor layers, in the growth onto the semipolar plane.

However, the inventors have discovered, on the way of experiments for improvement as described above, that the gallium nitride based semiconductor layer containing In is grown in the nitrogen atmosphere and the oxygen concentration of this gallium nitride based semiconductor layer is lower than those of the other layers not containing In grown in the hydrogen atmosphere. Therefore, when the gallium nitride based semiconductor layer not containing In is grown in the nitrogen atmosphere, the oxygen concentration of this gallium nitride based semiconductor layer can reduce. This can lower the internal resistance of the semiconductor device. It is verified by experiment that the oxygen concentration of the gallium nitride based semiconductor layer grown in the nitrogen atmosphere can be reduced and a low-resistance semiconductor device can be fabricated.

According to Inventors' research, the oxygen supply sources are considered to be such supply sources as impurities contained in the gas, such as the raw materials supplied into the growth reactor, and the jig other than them. When the impurities in the raw materials are oxygen supply sources, conceivable factors include "oxygen concentrations in the raw materials" and "incorporation coefficient of oxygen into crystal." According to Inventors' experiments, the oxygen concentration increases in the epitaxial semiconductor crystal in either of the hydrogen atmosphere and the nitrogen atmosphere in film formation with lowered purity of the source gas. From this result, the "incorporation coefficient of oxygen into crystal" is considered to be independent of the atmosphere gas.

On the other hand, when the oxygen sources are other than the raw materials, conceivable factors include "oxygen sources" such as the jig in the reactor, deposits, and residue of cleaner, "desorption coefficient of oxygen from oxygen sources," and "incorporation coefficient of oxygen into crystal." As described above, the "incorporation coefficient of oxygen into crystal" is independent of the atmosphere gas. Therefore, the rest "incorporation coefficient of oxygen into crystal" varies depending upon the atmosphere gas. Hydrogen works as reducing gas and makes oxygen desorbed from unwanted deposited materials such as deposits. It is considered that this oxygen is incorporated into the epitaxial crystal. For this reason, it is preferable to use nitrogen as atmosphere gas (carrier gas and sub-flow gas).

The present embodiment provides the Group III nitride semiconductor device having the p-type gallium nitride based semiconductor layer with the reduced oxygen concentration. Furthermore, the present embodiment provides the method for fabricating the Group III nitride semiconductor device, which can reduce the incorporation amount of oxygen impurity. Furthermore, the present embodiment provides the epitaxial substrate for the Group III nitride semiconductor device.

The principle of the present invention has been illustrated and described in the preferred embodiments thereof, but it is recognized by those skilled in the art, that the present invention can be modified in arrangement and detail without departing from the principle. The present invention is not limited to the specific configurations disclosed in the embodiments thereof Therefore, the applicants claim all corrections and modifications resulting from the scope of claims and the scope of spirit thereof.

EP . . . epitaxial substrate;
10 . . . growth reactor;
11 . . . Group III nitride semiconductor device;
13 . . . substrate;
15 . . . n-type Group III nitride semiconductor region;
17 . . . light emitting layer;
19 . . . p-type Group III nitride semiconductor region;
Cx . . . reference axis;
21 . . . first p-type gallium nitride based semiconductor layer;
23 . . . second p-type gallium nitride based semiconductor layer;
25 . . . p-type contact layer;
26 . . . p-type Group III nitride semiconductor lamination;
J1, J2 . . . junctions;
27 . . . active layer;
29 . . . n-side optical guiding layer;
31 . . . p-side optical guiding layer;
33 . . . semiconductor epitaxial layer;
35 . . . semiconductor epitaxial layer;
37 . . . first electrode;
39 . . . insulating film;
JC . . . contact;
41 . . . second electrode;
51 . . . substrate;
53 . . . Group III nitride semiconductor region;
55a . . . Si-doped GaN layer;
55b . . . Si-doped InAlGaN layer;
55c . . . Si-doped GaN layer;
59a . . . InGaN optical guiding layer;
59b . . . active layer;
59c . . . InGaN optical guiding layer;
61a . . . undoped InGaN barrier layer;
61b . . . undoped InGaN well layer;
65a . . . p-type GaN electron blocking layer;
65b . . . Mg-doped InGaN optical guiding layer;
65c . . . Mg-doped GaN optical guiding layer;
65d . . . Mg-doped InAlGaN cladding layer;
65e . . . high-concentration Mg-doped GaN contact layer;
EP1 . . . epitaxial substrate.

What is claimed is:

1. A Group III nitride semiconductor device comprising:
a substrate having an electrically conductivity, the substrate including a primary surface, the primary surface comprising a first gallium nitride based semiconductor;
a Group III nitride semiconductor region including a first p-type gallium nitride based semiconductor layer and provided on the primary surface,
a p-type contact layer, the first p-type gallium nitride based semiconductor layer being provided between the substrate and the p-type contact layer, and the p-type contact layer comprising oxygen as impurity, and an oxygen concentration of the p-type contact layer being more than that of the first p-type gallium nitride based semiconductor layer, and
an electrode in direct contact with the p-type contact layer,
the primary surface of the substrate being inclined at an angle in a range of not less than 50 degrees and less than 130 degrees from a plane perpendicular to a reference axis, the reference axis extending along a c-axis of the first gallium nitride based semiconductor,
an oxygen concentration Noxg of the first p-type gallium nitride based semiconductor layer being not more than $5 \times 10^{17}$ cm$^{-3}$, and
a ratio (Noxg/Npd) of the oxygen concentration Noxg to a p-type dopant concentration Npd of the first p-type gallium nitride based semiconductor layer being not more than $1/10$.

2. The Group III nitride semiconductor device according to claim 1, wherein the first p-type gallium nitride based semiconductor layer does not contain indium as a Group III constituent element.

3. The Group III nitride semiconductor device according to claim 1, further comprising:
an n-type gallium nitride based semiconductor layer provided on the primary surface; and
a gallium nitride based semiconductor layer for a light emitting layer,
wherein the light emitting layer is provided between the p-type gallium nitride based semiconductor layer and the n-type gallium nitride based semiconductor layer, and
wherein the Group III nitride semiconductor device comprises a light emitting device.

4. The Group III nitride semiconductor device according to claim 3, wherein an emission wavelength of the light emitting layer is not less than 440 nm and not more than 600 nm.

5. The Group III nitride semiconductor device according to claim 3, wherein an emission wavelength of the light emitting layer is not less than 490 nm and not more than 600 nm.

6. The Group III nitride semiconductor device according to claim 3, further comprising an electrode making contact with the Group III nitride semiconductor region,
wherein the Group III nitride semiconductor region includes a contact layer making contact with the electrode, and a p-type Group III nitride semiconductor region,
wherein the p-type Group III nitride semiconductor region is provided between the contact layer and the light emitting layer,
wherein the p-type Group III nitride semiconductor region makes a first junction with the contact layer and a second junction with the light emitting layer, wherein an oxygen concentration of the p-type Group III nitride semiconductor region is not more than $5 \times 10^{17}$ cm$^{-3}$, and wherein a ratio (Noxg/Npd) of the oxygen concentration Noxg to a p-type dopant concentration Npd of the p-type Group III nitride semiconductor region is not more than 1/10.

7. The Group III nitride semiconductor device according to claim 1, wherein the first p-type gallium nitride based semiconductor layer comprises any one of GaN, InGaN, AlGaN, and InAlGaN.

8. The Group III nitride semiconductor device according to claim 1, wherein the first p-type gallium nitride based semiconductor layer comprises either one of GaN and AlGaN.

9. The Group III nitride semiconductor device according to claim 1, wherein a carbon concentration of the first p-type gallium nitride based semiconductor layer is not more than $1 \times 10^{17}$ cm$^{-3}$.

10. The Group III nitride semiconductor device according to claim 1, wherein the Group III nitride semiconductor region further includes a second p-type gallium nitride based semiconductor layer provided on the primary surface, wherein an oxygen concentration of the second p-type gallium nitride based semiconductor layer is not more than $5 \times 10^{17}$ cm$^{-3}$, wherein the second p-type gallium nitride based semiconductor layer contains indium as a Group III constituent element, and wherein a ratio (Noxg/Npd) of the oxygen concentration Noxg to a p-type dopant concentration Npd of the second p-type gallium nitride based semiconductor layer is not more than 1/10.

11. An epitaxial substrate for a Group III nitride semiconductor device, comprising:

a substrate having an electrically conductivity, the substrate including a primary surface, and the primary surface comprising a first gallium nitride based semiconductor;

a Group III nitride semiconductor region including a first p-type gallium nitride based semiconductor layer and provided on the primary surface, a p-type contact layer, the first p-type gallium nitride based semiconductor layer being provided between the substrate and the p-type contact layer, and the p-type contact layer comprising oxygen as impurity, and an oxygen concentration of the p-type contact layer being more than that of the first p-type gallium nitride based semiconductor layer, and an electrode in direct contact with the p-type contact layer, the primary surface of the substrate being inclined at an angle in a range of not less than 50 degrees and less than 130 degrees from a plane perpendicular to a reference axis, the reference axis extending along a c-axis of the first gallium nitride based semiconductor, an oxygen concentration Noxg of the first p-type gallium nitride based semiconductor layer being not more than $5 \times 10^{17}$ cm$^{-3}$, and a ratio (Noxg/Npd) of the oxygen concentration Noxg to a p-type dopant concentration Npd of the first p-type gallium nitride based semiconductor layer being not more than 1/10.

12. The epitaxial substrate according to claim 11, wherein the first p-type gallium nitride based semiconductor layer does not contain indium as a Group III constituent element.

13. The epitaxial substrate according to claim 11, further comprising:

an n-type gallium nitride based semiconductor layer provided on the primary surface; and a gallium nitride based semiconductor layer for a light emitting layer, wherein the light emitting layer is provided between the p-type gallium nitride based semiconductor layer and the n-type gallium nitride based semiconductor layer, and wherein the Group III nitride semiconductor device comprises a light emitting device.

14. The epitaxial substrate according to claim 13, wherein an emission wavelength of the light emitting layer is not less than 440 nm and not more than 600 nm.

15. The epitaxial substrate according to claim 13, wherein an emission wavelength of the light emitting layer is not less than 490 nm and not more than 600 nm.

16. The epitaxial substrate according to claim 13, wherein the whole of the Group III nitride semiconductor region has p-type conductivity, wherein an oxygen concentration of the Group III nitride semiconductor region is not more than $5 \times 10^{17}$ cm$^{-3}$, and wherein a ratio (Noxg/Npd) of the oxygen concentration Noxg to a p-type dopant concentration Npd of the Group III nitride semiconductor region is not more than 1/10.

17. The epitaxial substrate according to claim 11, wherein the first p-type gallium nitride based semiconductor layer comprises any one of GaN, InGaN, AlGaN, and InAlGaN.

18. The epitaxial substrate according to claim 12, wherein the first p-type gallium nitride based semiconductor layer comprises either one of GaN and AlGaN.

19. The epitaxial substrate according to claim 11, wherein a carbon concentration of the first p-type gallium nitride based semiconductor layer is not more than $1 \times 10^{17}$ cm$^{-3}$.

20. The epitaxial substrate according to claim 11, wherein the Group III nitride semiconductor region further includes a second p-type gallium nitride based semiconductor layer provided on the primary surface, wherein an oxygen concentration of the second p-type gallium nitride based semiconductor layer is not more than $5 \times 10^{17}$ cm$^{-3}$, wherein the second p-type gallium nitride based semiconductor layer contains indium as a Group III constituent element, and wherein a ratio (Noxg/Npd) of the oxygen concentration Noxg to a p-type dopant concentration Npd of the second p-type gallium nitride based semiconductor layer is not more than 1/10.

21. The epitaxial substrate according to claim 11, wherein a surface roughness of the epitaxial substrate is not more than 1 nm in an arithmetic average roughness.

22. A Group III nitride semiconductor device comprising:

a substrate having an electrically conductivity, the substrate including a primary surface, the primary surface comprising a first gallium nitride based semiconductor;

a Group III nitride semiconductor region including a first p-type gallium nitride based semiconductor layer and provided on the primary surface, a p-type contact layer, the first p-type gallium nitride based semiconductor layer being provided between the substrate and the p-type contact layer, and an oxygen concentration of the p-type contact layer being more than $5 \times 10^{17}$ cm$^{-3}$, and an electrode in direct contact with the p-type contact layer, the primary surface of the substrate being inclined at an angle in a range of not less than 50 degrees, and less than 130 degrees from a plane perpendicular to a reference axis, the reference axis extending along a c-axis of the first gallium nitride based semiconductor, an oxygen concentration Noxg of the first p-type gallium nitride based semiconductor layer being not more than $5 \times 10^{17}$ cm$^{-3}$, and a ratio (Noxg/Npd) of the oxygen concentration Noxg to a p-type dopant concentration Npd of the first p-type gallium nitride based semiconductor layer being not more than $1/10$.

* * * * *